(12) United States Patent
Seo

(10) Patent No.: US 11,121,286 B2
(45) Date of Patent: Sep. 14, 2021

(54) SEMICONDUCTOR DEVICE

(71) Applicant: SUZHOU LEKTN SEMICONDUCTOR CO., LTD., Taicang (CN)

(72) Inventor: Jae Won Seo, Seoul (KR)

(73) Assignee: SUZHOU LEKTN SEMICONDUCTOR CO., LTD., Taicang (CN)

( * ) Notice: Subject to any disclaimer, the term of this patent is extended or adjusted under 35 U.S.C. 154(b) by 124 days.

(21) Appl. No.: 16/472,429

(22) PCT Filed: Dec. 21, 2017

(86) PCT No.: PCT/KR2017/015267
§ 371 (c)(1),
(2) Date: Jun. 21, 2019

(87) PCT Pub. No.: WO2018/117699
PCT Pub. Date: Jun. 28, 2018

(65) Prior Publication Data
US 2020/0194628 A1   Jun. 18, 2020

(30) Foreign Application Priority Data

Dec. 23, 2016   (KR) .................. 10-2016-0177357

(51) Int. Cl.
*H01L 33/00* (2010.01)
*H01L 33/40* (2010.01)
(Continued)

(52) U.S. Cl.
CPC ............ *H01L 33/405* (2013.01); *H01L 27/15* (2013.01); *H01L 33/46* (2013.01); *H01L 33/62* (2013.01);
(Continued)

(58) Field of Classification Search
CPC ......... H01L 33/08; H01L 33/36; H01L 33/42; H01L 33/60; H01L 33/00; H01L 33/20;
(Continued)

(56) References Cited

U.S. PATENT DOCUMENTS

2009/0134420 A1   5/2009  Nagai
2010/0155693 A1   6/2010  Seo
(Continued)

FOREIGN PATENT DOCUMENTS

EP             2983216 A1    2/2016
KR      10-2012-0019897 A    3/2012
(Continued)

OTHER PUBLICATIONS

International Search Report (PCT/ISA/210) issued in PCT/KR2017/015267, dated Apr. 16, 2018.

*Primary Examiner* — Chuong A Luu
(74) *Attorney, Agent, or Firm* — Birch, Stewart, Kolasch & Birch, LLP

(57) ABSTRACT

A semiconductor device according to an embodiment includes a substrate, first and second light emitting structures disposed on the substrate, a first reflective electrode disposed on the first light emitting structure, a second reflective electrode disposed on the second light emitting structure, a connection electrode, a first electrode pad, and a second electrode pad. According to the embodiment, the first light emitting structure includes a first semiconductor layer of a first conductivity type, a first active layer disposed on the first semiconductor layer, a second semiconductor layer of a second conductivity type and disposed on the first active layer, and a first through hole provided through the second semiconductor layer and the first active layer to expose the first semiconductor layer. The second light emitting structure is spaced apart from the first light emitting structure and includes a third semiconductor layer of the first conductivity (Continued)

type, a second active layer disposed on the third semiconductor layer, and a fourth semiconductor layer of the second conductivity type and disposed on the second active layer.

19 Claims, 16 Drawing Sheets

(51) Int. Cl.
    *H01L 27/15*      (2006.01)
    *H01L 33/46*      (2010.01)
    *H01L 33/62*      (2010.01)
    *H01L 33/22*      (2010.01)

(52) U.S. Cl.
    CPC ...... *H01L 33/22* (2013.01); *H01L 2933/0016* (2013.01); *H01L 2933/0025* (2013.01)

(58) Field of Classification Search
    CPC ......... H01L 33/22; H01L 33/38; H01L 33/40; H01L 33/46; H01L 33/62; H01L 33/385; H01L 33/405; H01L 33/648; H01L 27/15; H01L 27/156; H01L 2933/0016; H01L 2933/0025
    USPC .......................................................... 257/88
    See application file for complete search history.

(56) References Cited

U.S. PATENT DOCUMENTS

| | | |
|---|---|---|
| 2012/0049223 A1 | 3/2012 | Yang et al. |
| 2012/0074441 A1* | 3/2012 | Seo ..................... H01L 33/0095 257/91 |
| 2016/0043280 A1 | 2/2016 | Moon et al. |
| 2016/0087149 A1 | 3/2016 | Miyachi et al. |
| 2016/0211410 A1* | 7/2016 | Jang ..................... H01L 27/153 |
| 2018/0026163 A1 | 1/2018 | Seo et al. |

FOREIGN PATENT DOCUMENTS

| | | |
|---|---|---|
| KR | 10-2013-0030279 A | 3/2013 |
| KR | 10-2016-0016846 A | 2/2016 |
| KR | 10-2016-0115301 A | 10/2016 |

* cited by examiner

【FIG. 1】
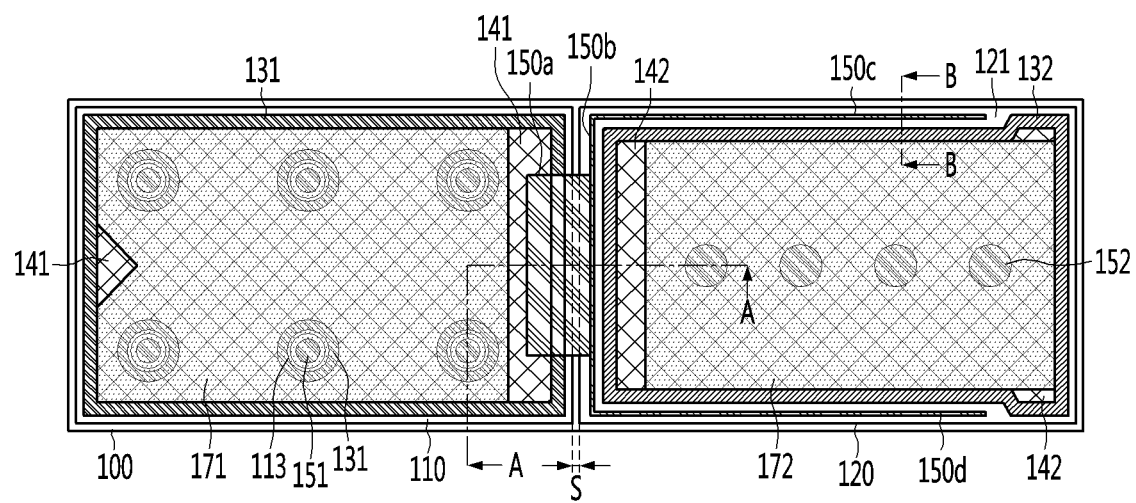
【FIG. 2】
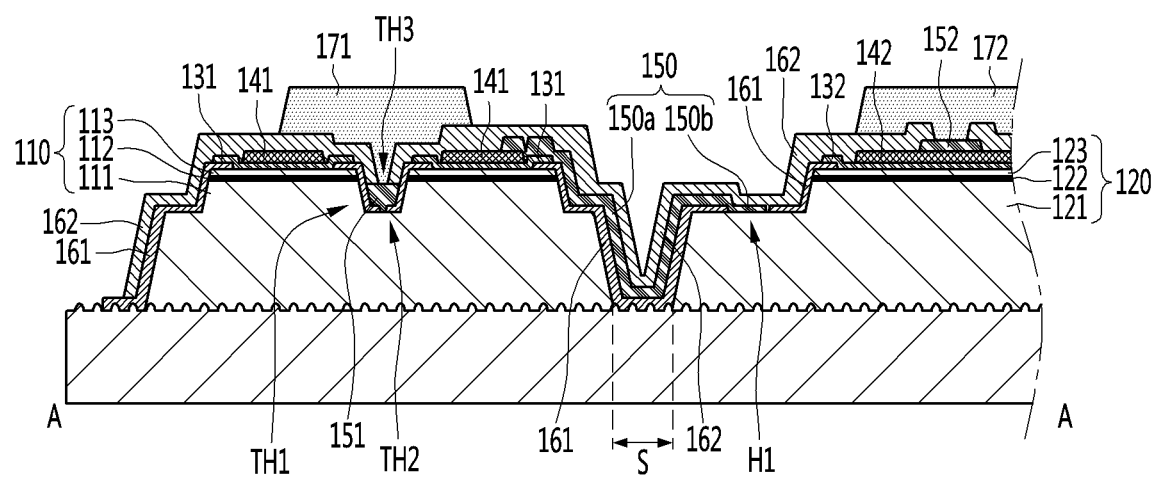

[FIG. 3]
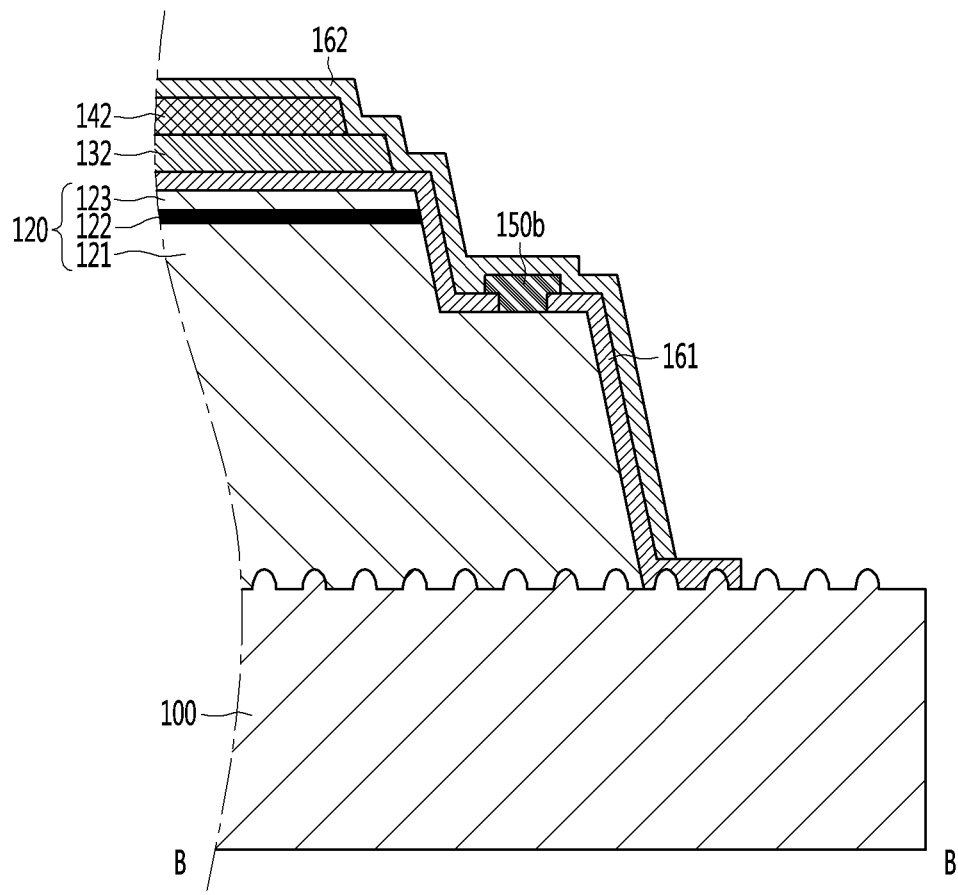
[FIG. 4]
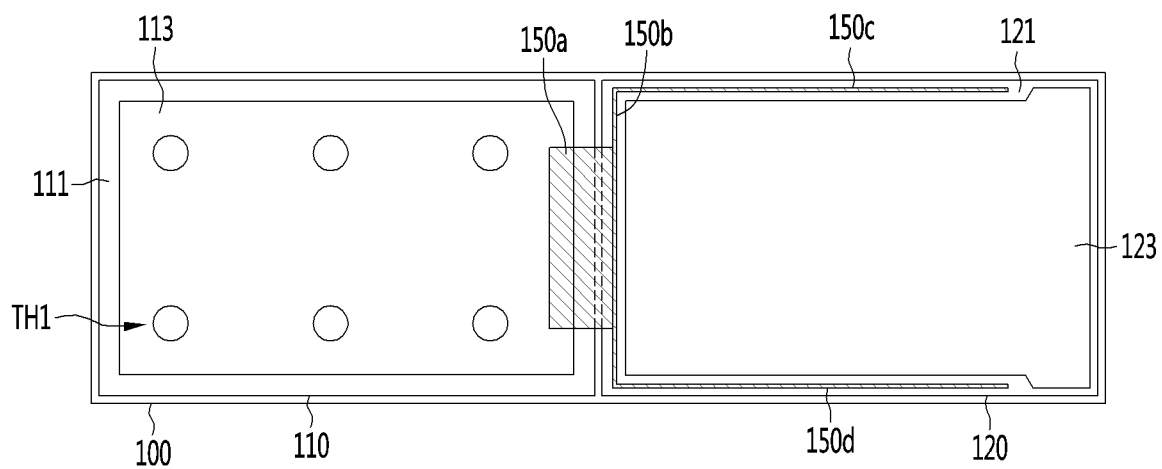

[FIG. 5]
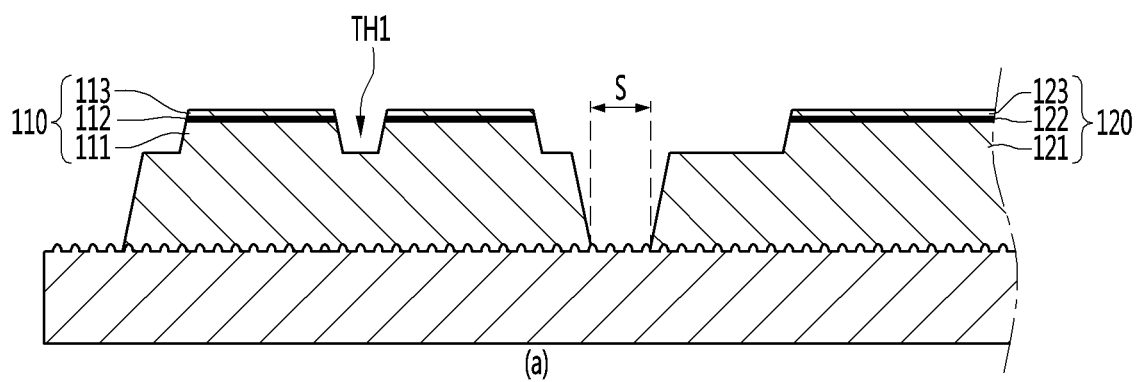
(a)
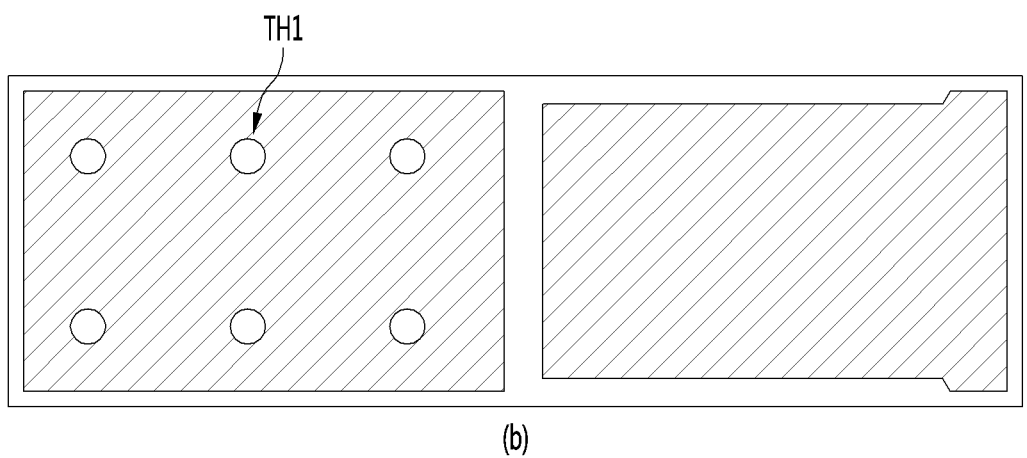
(b)
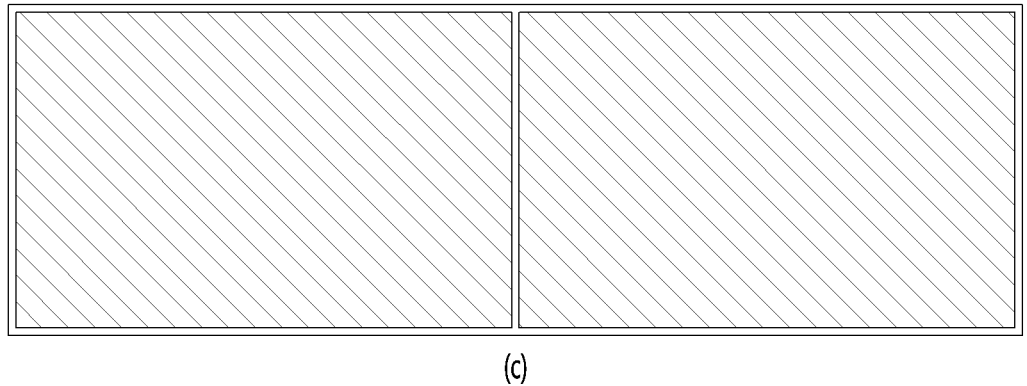
(c)

【FIG. 6】
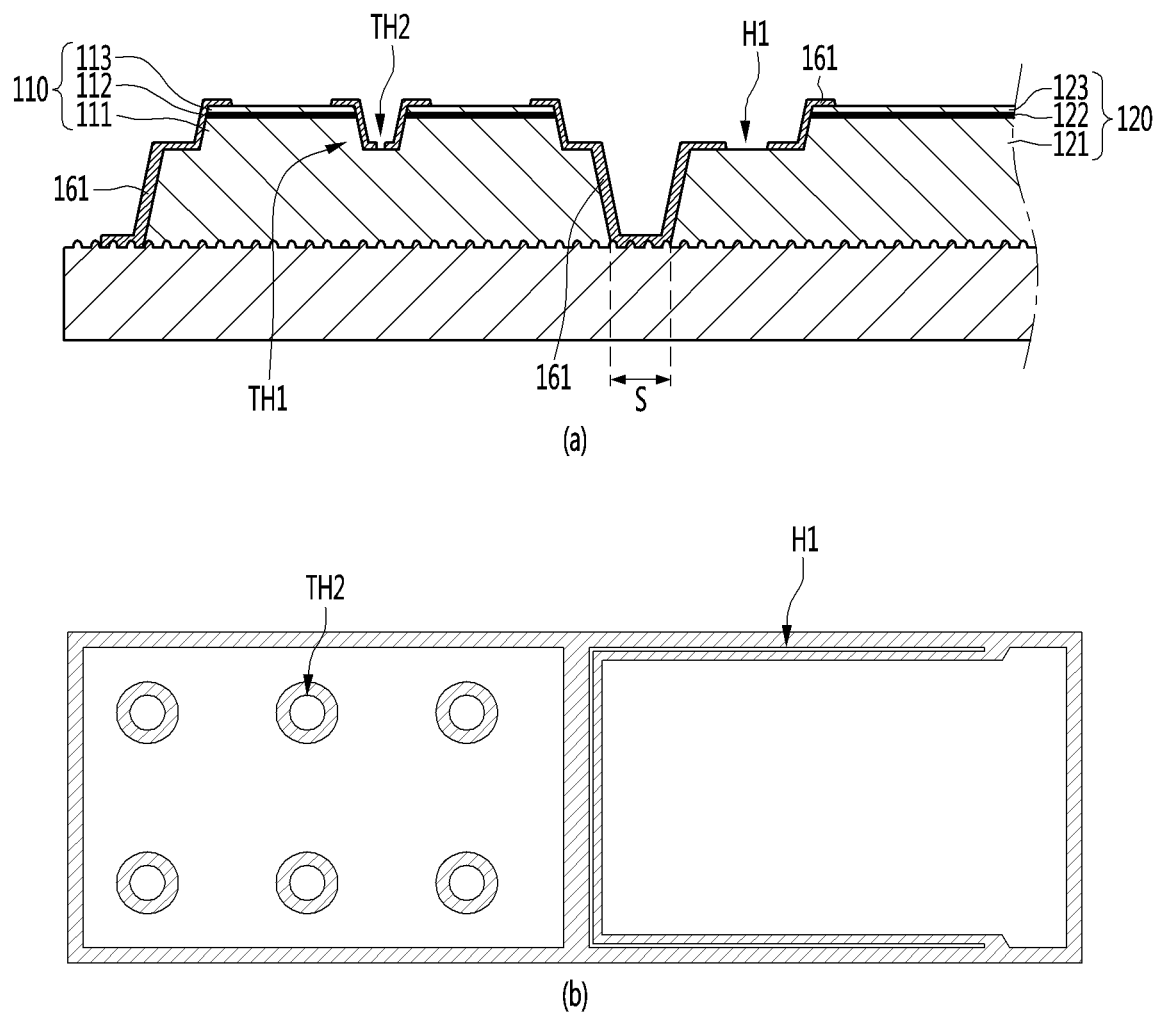

[FIG. 7]
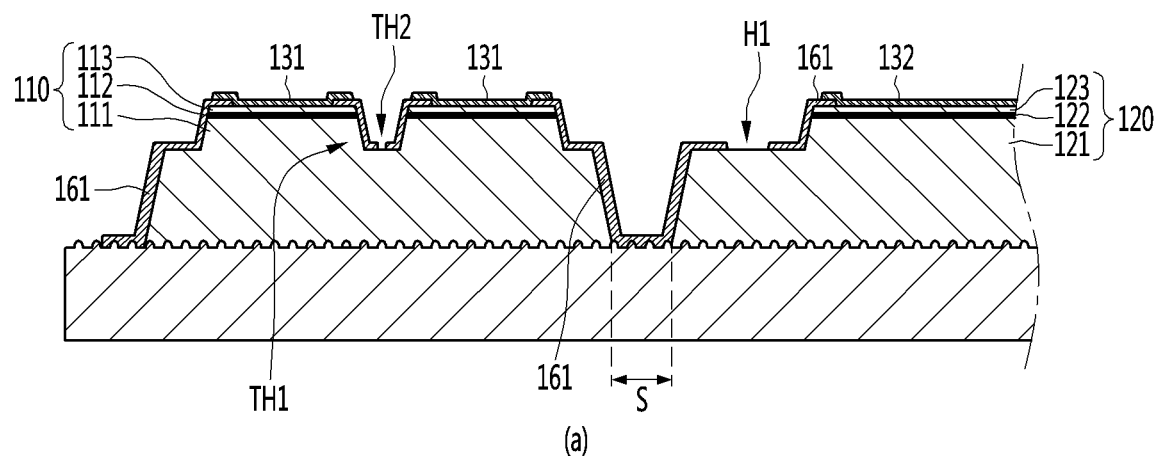
(a)
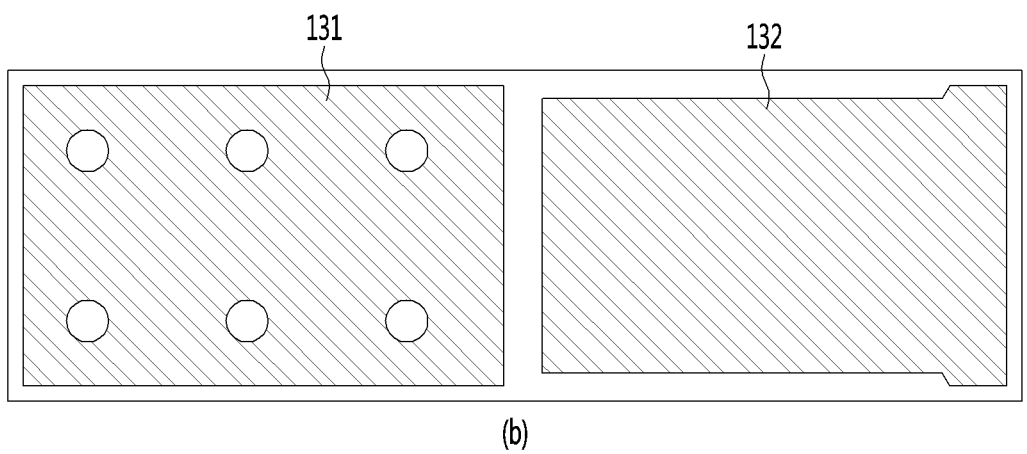
(b)

[FIG. 8]
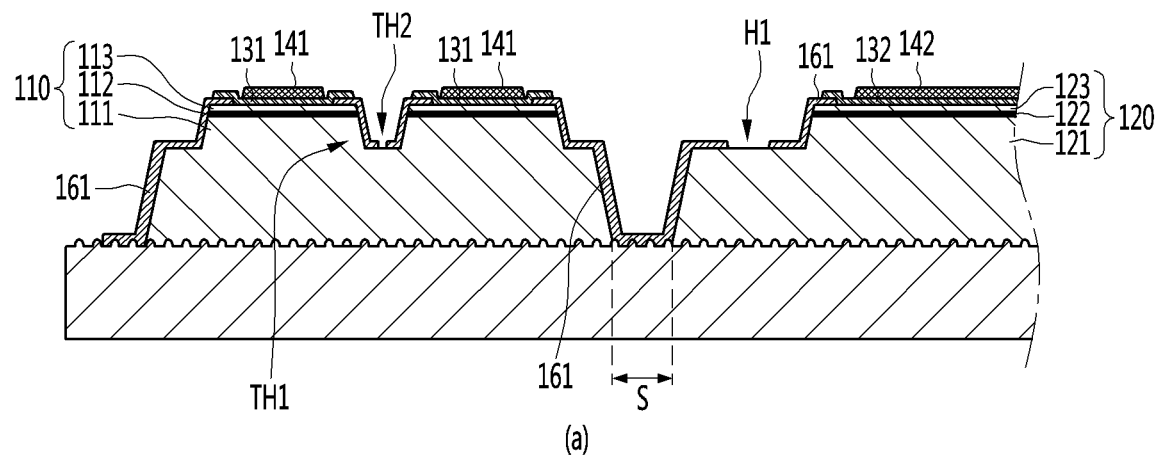
(a)
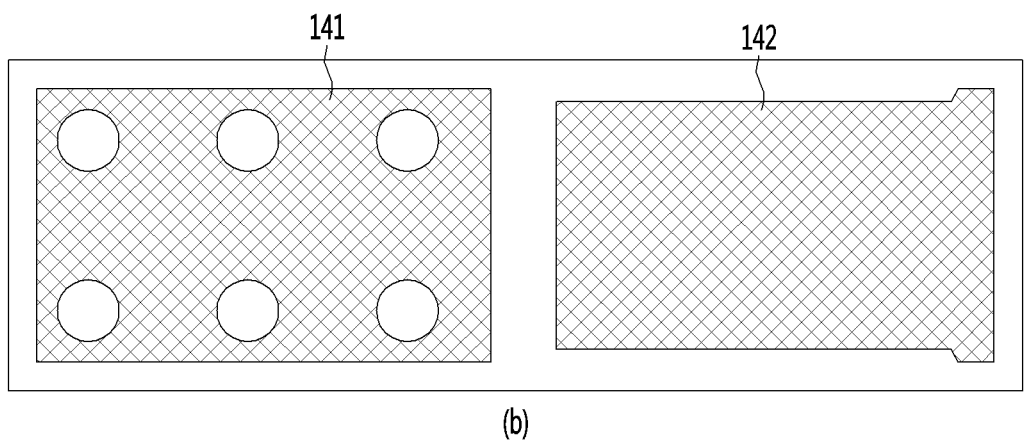
(b)

[FIG. 9]
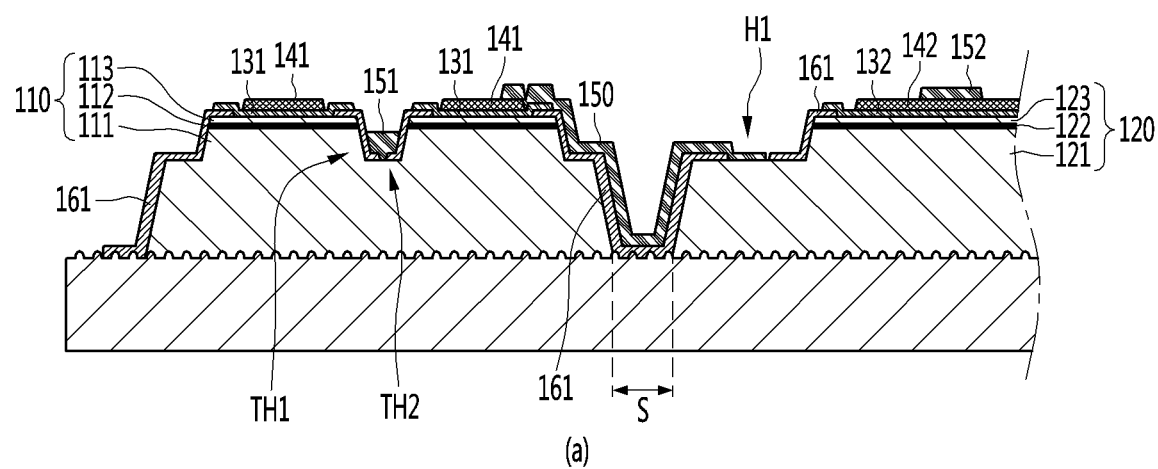
(a)
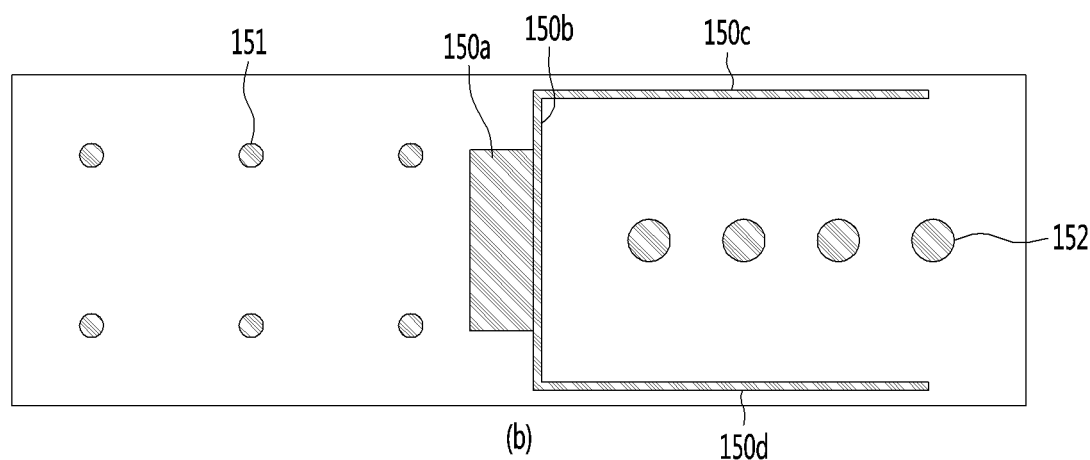
(b)

[FIG. 10]
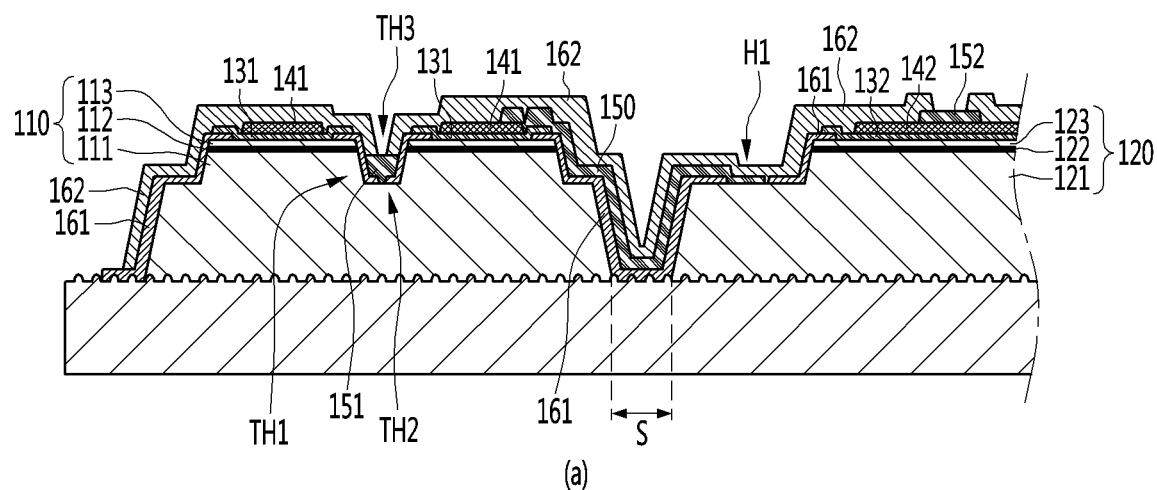
(a)
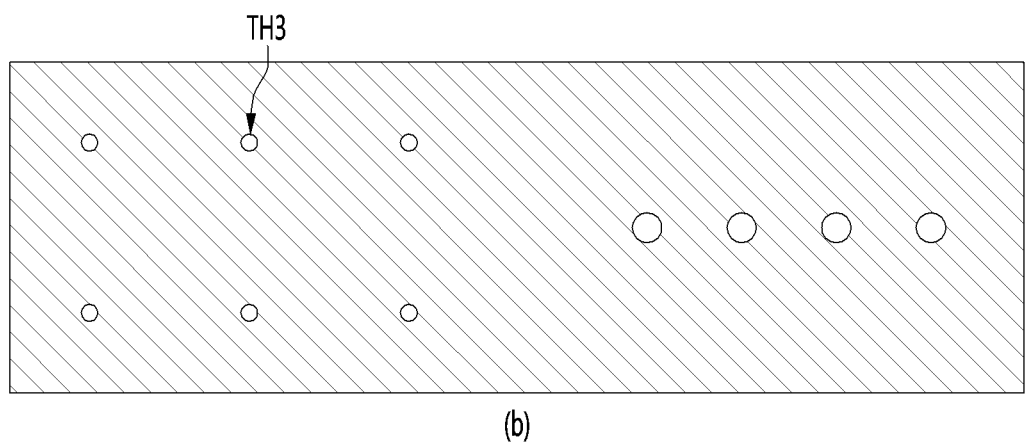
(b)

【FIG. 11】
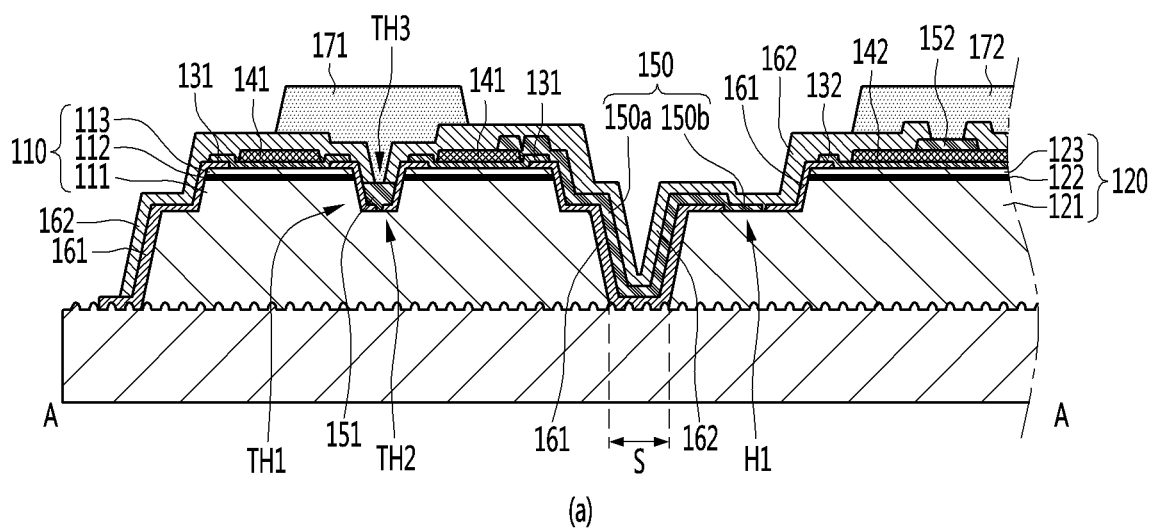
(a)
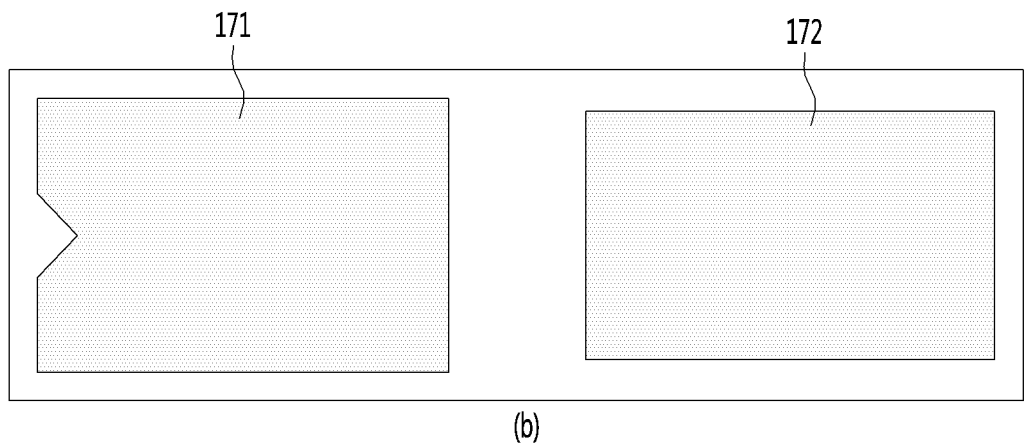
(b)

[FIG. 12]
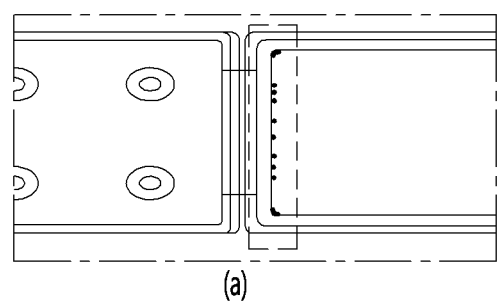
(a)
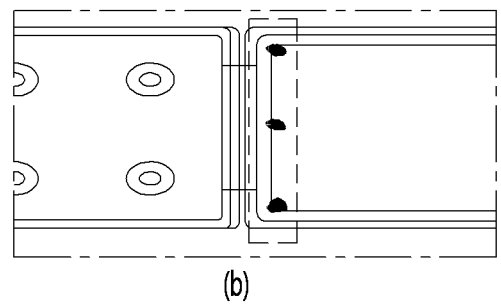
(b)

[FIG. 13]
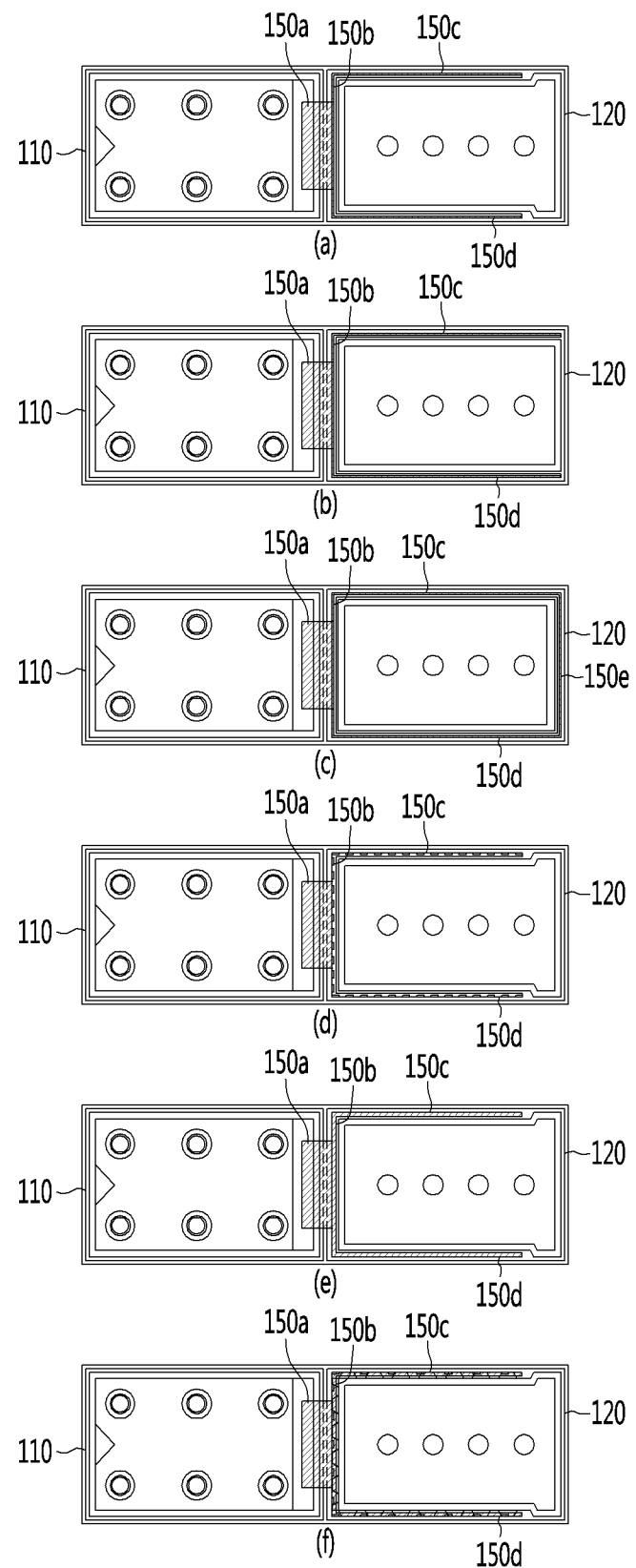

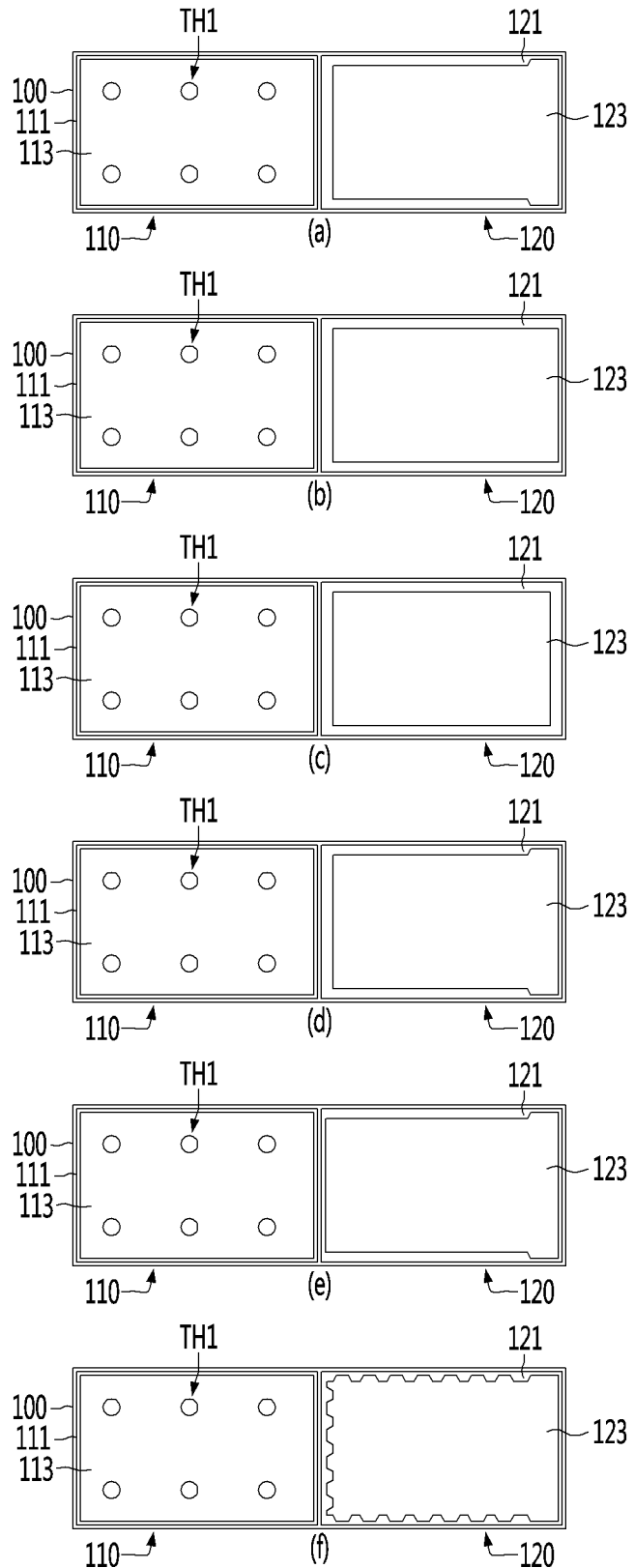

[FIG. 15]
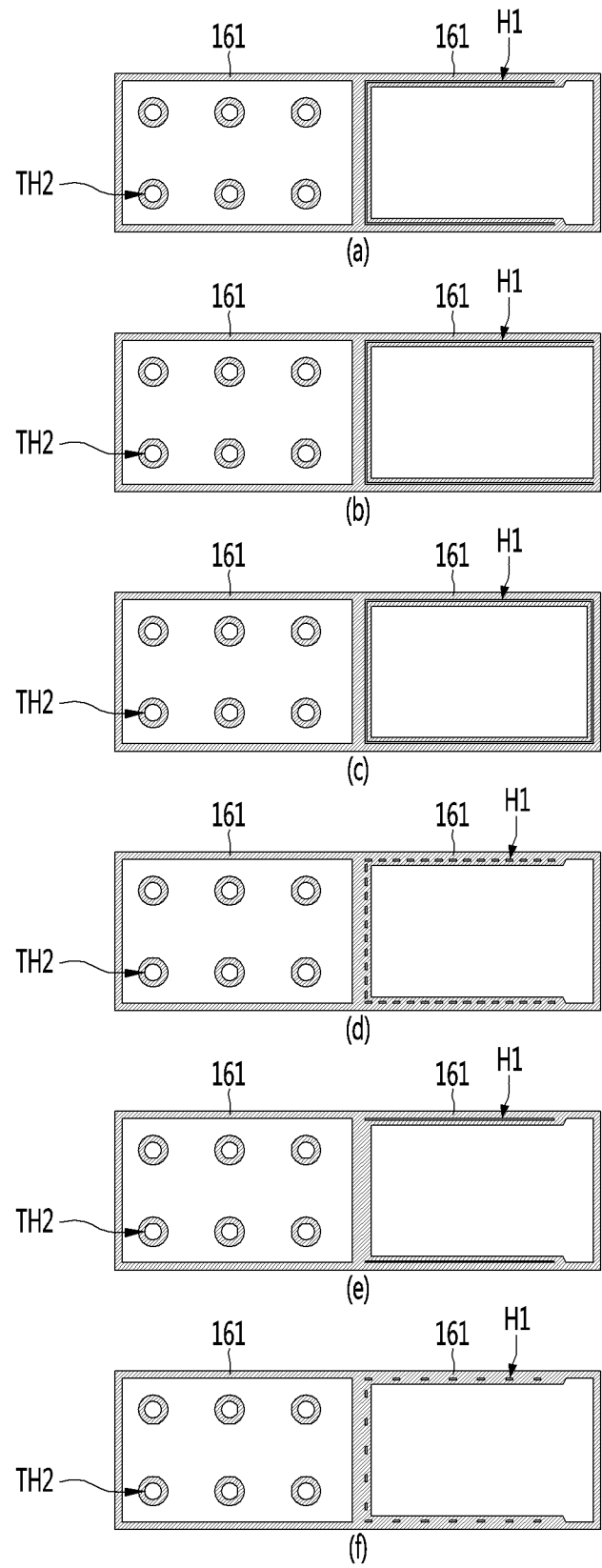

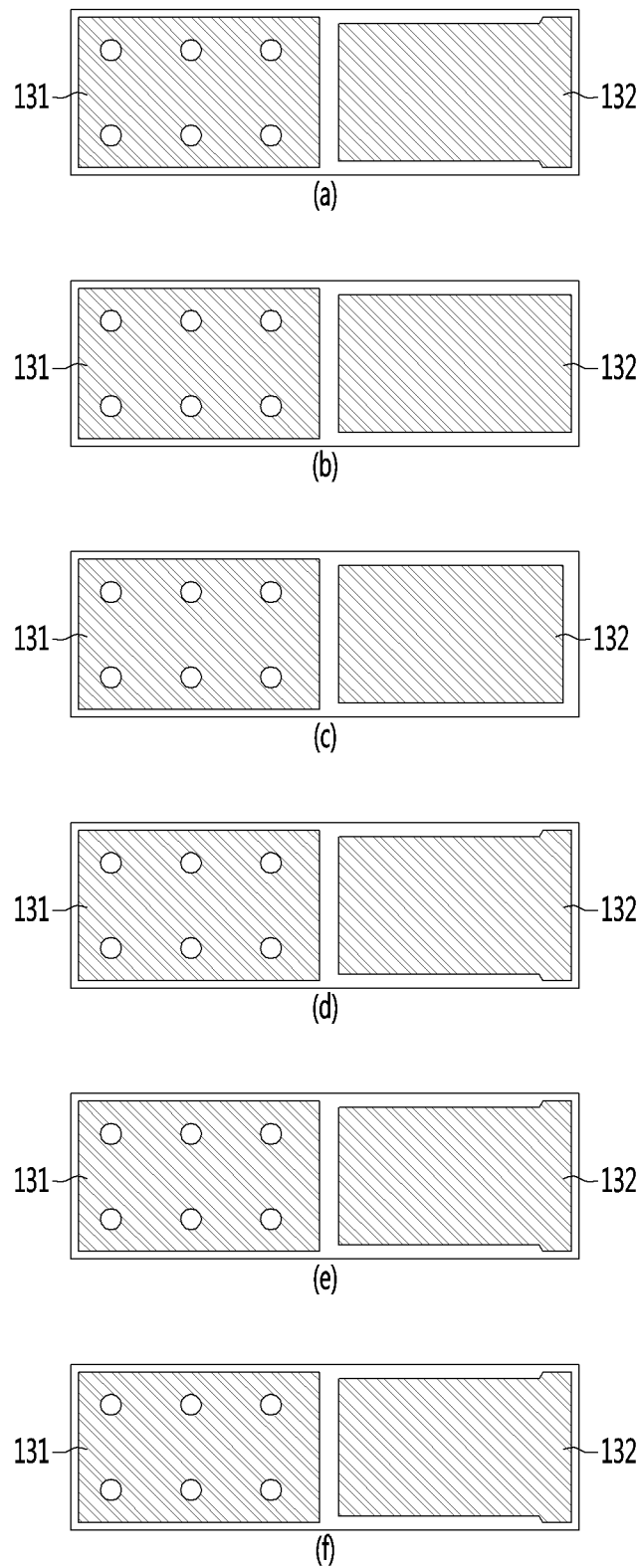
[FIG. 16]

【FIG. 17】
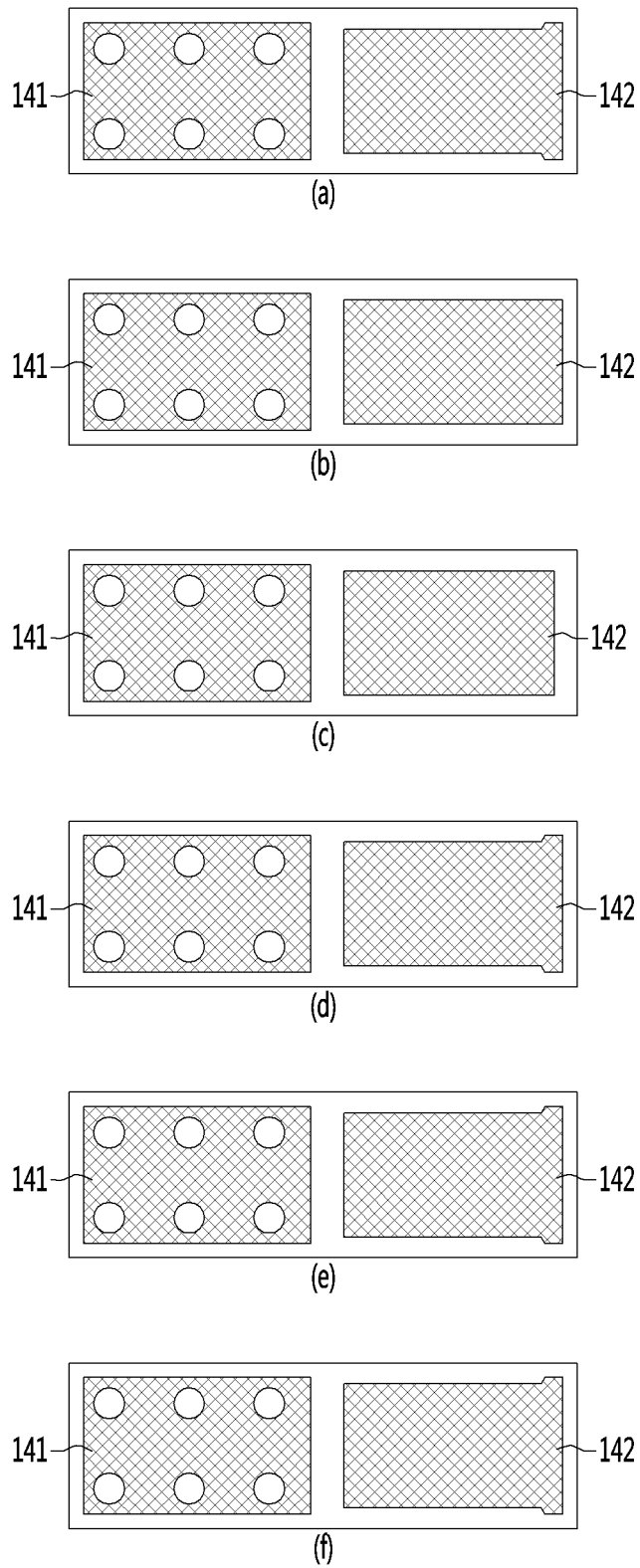

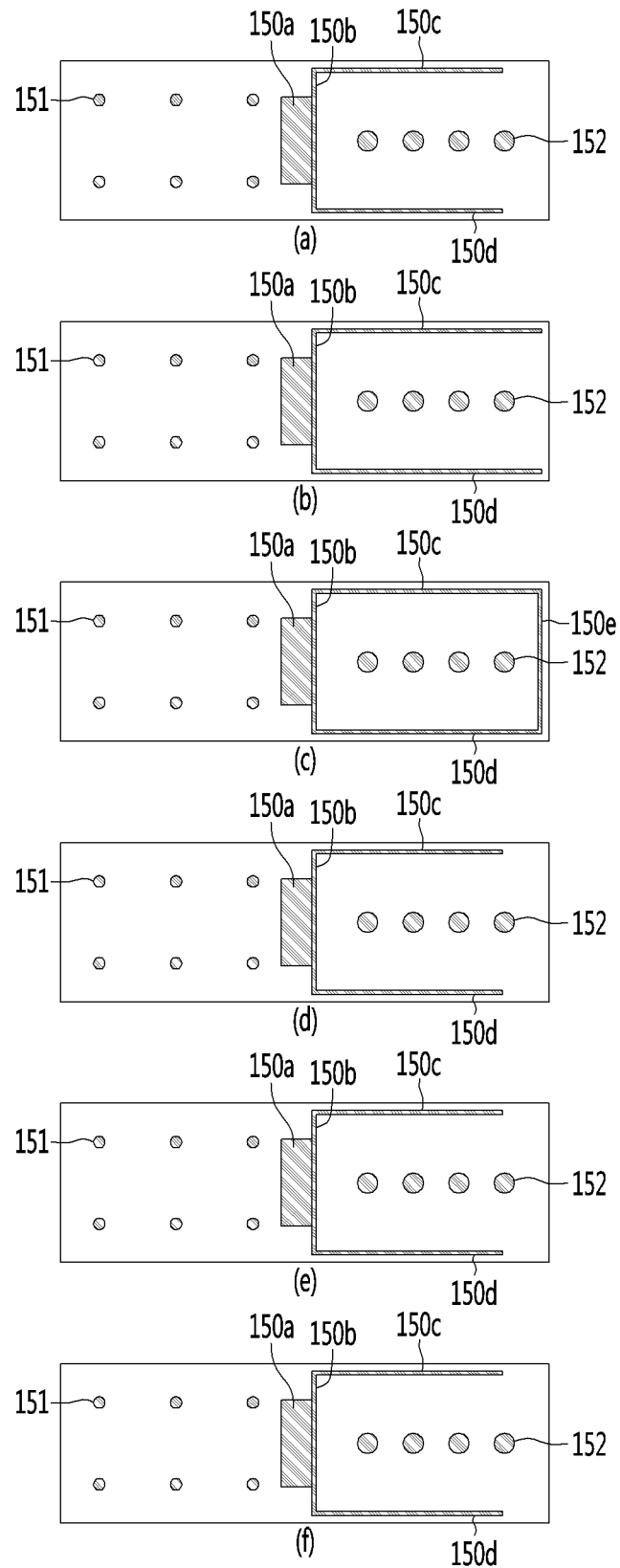
[FIG. 18]

SEMICONDUCTOR DEVICE

CROSS REFERENCE TO RELATED APPLICATIONS

This application is the National Phase of PCT International Application No. PCT/KR2017/015267, filed on Dec. 21, 2017, which claims priority under 35 U.S.C. 119(a) to Patent Application No. 10-2016-0177357, filed in the Republic of Korea on Dec. 23, 2016, all of which are hereby expressly incorporated by reference into the present application.

TECHNICAL FIELD

Embodiments relate to a semiconductor device and a method of manufacturing a semiconductor device.

BACKGROUND ART

A semiconductor device comprising compounds such as GaN and AlGaN has many merits such as wide and easily adjustable bandgap energy, so the device can be used variously as light emitting devices, light receiving devices, and various kinds of diodes.

In particular, light emitting devices such as light emitting diodes and laser diodes obtained by using a group III-V or group II-VI compound semiconductor material can implement light having various wavelength band such as red, green, blue, and ultraviolet rays due to the development of thin film growth technology and device materials. In addition, the light emitting devices such as light emitting diodes and laser diodes obtained by using group III-V or group II-VI compound semiconductor material can implement a white light source having high efficiency by using fluorescent substances or combining colors. Such a light emitting device has advantages such as low power consumption, semi-permanent lifetime, quick response speed, safety, and environment friendliness compared with conventional light sources such as fluorescent lamps and incandescent lamps.

In addition, when a light receiving device such as a photodetector or a solar cell is manufactured using a group III-V or a group II-VI compound semiconductor substances, a photoelectric current is generated by absorbing light having various wavelength domains with the development of device materials, so that light having various wavelength domains such as from gamma rays to radio waves can be used. In addition, the above light receiving device has advantages such as quick response speed, safety, environmental friendliness and easy control of device materials, so that the light receiving device can be easily used for a power control, a super-high frequency circuit or a communication module.

Accordingly, the semiconductor device has been applied and expanded to a transmission module of an optical communication tool, a light emitting diode backlight replacing a cold cathode fluorescent lamp (CCFL) constituting a backlight of a liquid crystal display (LCD), a white light emitting diode lighting apparatus replaceable with a fluorescent lamp or an incandescent bulb, a vehicular headlight, a traffic light and a sensor for detecting gas or fire. In addition, the applications of the semiconductor device can be expanded to a high frequency application circuit, a power control apparatus, or a communication module.

For example, the light emitting device may be provided as a p-n junction diode having a characteristic in which electrical energy is converted into light energy by using a group III-V element or a group II-VI element in the periodic table, and various wavelengths can be realized by adjusting the composition ratio of the compound semiconductor substances.

For example, since a nitride semiconductor has high thermal stability and wide bandgap energy, it has received great attention in the field of development of optical devices and high power electronic devices. Particularly, a blue light emitting device, a green light emitting device, an ultraviolet (UV) light emitting device, and a red light emitting device using the nitride semiconductor are commercialized and widely used.

For example, the ultraviolet light emitting device refers to a light emitting diode that generates light distributed in a wavelength range of 200 nm to 400 nm. In the above wavelength range, a short wavelength may be used for sterilization, purification or the like and a long wavelength may be used for a stepper, a curing apparatus or the like.

Ultraviolet rays may be classified into UV-A (315 nm to 400 nm), UV-B (280 nm to 315 nm) and UV-C (200 nm to 280 nm) in an order of the long wavelength. The UV-A (315 nm to 400 nm) domain is applied to various fields such as industrial UV curing, curing of printing ink, exposure machine, discrimination of counterfeit money, photocatalytic sterilization, special lighting (such as aquarium/agriculture), the UV-B (280 nm to 315 nm) domain is applied to medical use, and the UV-C (200 nm to 280 nm) domain is applied to air purification, water purification, sterilization products and the like.

Meanwhile, as a semiconductor device capable of providing a high output has been requested, studied on a semiconductor device capable of increasing an output power by applying a high power source has been proceeding. For example, studies have been made on semiconductor devices in which a plurality of light emitting structures are electrically connected as a means for providing a high output. At this time, when high power is applied, there is a demand for a semiconductor device capable of providing light of high power and capable of stably supplying power to a plurality of light emitting structures and ensuring reliability.

DETAIL DESCRIPTION OF THE INVENTION

Technical Problem

An embodiment can provide a semiconductor device that can be applied with high power and can provide light with high power and a method of manufacturing the semiconductor device.

An embodiment can provide a semiconductor device which can connect a plurality of light emitting structures in series and prevent the current concentration phenomenon from occurring, thereby improving the reliability and a method of manufacturing the semiconductor device.

Technical Solution

A semiconductor device according to an embodiment may comprise a first light emitting structure disposed on the substrate, the first light emitting structure comprising a first semiconductor layer of a first conductivity type, a first active layer disposed on the first semiconductor layer, and a second semiconductor layer of a second conductivity type, the first light emitting structure providing a first through hole through the second semiconductor layer and the active layer to expose the first semiconductor layer; a second light emitting structure disposed on the substrate and spaced apart from the first light emitting structure, the second light emitting structure comprising a third semiconductor layer of the first conductivity type, a second active layer disposed on the third semiconductor layer, and a fourth semiconductor layer of the second conductivity type; a first reflective electrode disposed on the second semiconductor layer of the first light emitting structure; a second reflective electrode disposed on the fourth semiconductor layer of the second light emitting structure; a connection electrode electrically connected to the second semiconductor layer of the first light emitting structure and the third semiconductor layer of the second light emitting structure; a first electrode pad disposed on the first light emitting structure and electrically connected to the first semiconductor layer through the first through hole of the first light emitting structure; and a second electrode pad disposed on the second light emitting structure and electrically connected to the second reflective electrode.

According to the embodiment, wherein the first electrode pad, the first semiconductor layer, the second semiconductor layer, the connection electrode, the third semiconductor layer, the fourth semiconductor layer, and the second electrode pad may be electrically connected in series.

According to the embodiment, the light emitting device may comprise a first ohmic contact layer disposed between the first reflective electrode and the second semiconductor layer; and a second ohmic contact layer disposed between the second reflective electrode and the fourth semiconductor layer.

According to the embodiment, wherein the connection electrode may be in contact with an upper surface of the third semiconductor layer and an upper surface of the first reflective electrode.

According to the embodiment, wherein the connection electrode may be disposed between a side surface of the first light emitting structure and a side surface of the second light emitting structure facing each other.

According to the embodiment, wherein the connection electrode may comprise a main electrode, a first branch electrode directly connected to the main electrode, a second branch electrode extended from an end of the first branch electrode, and a third branch electrode extended from the other end of the first branch electrode, wherein a first region of the main electrode may be disposed on the second semiconductor layer and a second region of the main electrode may be disposed between a side surface of the first light emitting structure and a side surface of the second light emitting structure, and wherein the first branch electrode, the second branch electrode, and the third branch electrode may be disposed on the third semiconductor layer.

The semiconductor device according to the embodiment may further comprise a first insulating layer providing a contact region for exposing an upper surface of the third semiconductor layer, and wherein the first branch electrode, the second branch electrode, the third branch electrode, and the third semiconductor layer are electrically connected through the contact region.

According to the embodiment, wherein the first branch electrode, the second branch electrode, and the third branch electrode may be disposed in contact with the upper surface of the third semiconductor layer through the contact region.

According to the embodiment, wherein the contact region may be provided in a linear shape along an extending direction of the first branch electrode, the second branch electrode, and the third branch electrode.

According to the embodiment, wherein the contact region may be provided in a plurality of hole shapes along an extending direction of the first branch electrode, the second branch electrode, and the third branch electrode.

The semiconductor device according to the embodiment may further comprise a fourth branch electrode disposed on the third semiconductor layer and connecting the second branch electrode and the third branch electrode, wherein the first branch electrode, the second branch electrode, the third branch electrode, and the fourth branch electrode may be disposed around the second light emitting structure to provide a closed loop.

According to the embodiment, wherein a region of the first insulating layer disposed between the side surface of the first light emitting structure and the side surface of the second light emitting structure may not comprise a contact region exposing an upper surface of the third semiconductor layer.

According to the embodiment, wherein a side surfaces of the third semiconductor layer disposed under the first branch electrode, the second branch electrode, and the third branch electrode may be provided in a concavo-convex shape.

According to the embodiment, wherein the first insulating layer may comprise a second through hole exposing an upper surface of the first semiconductor layer, the semiconductor device may further comprise a second insulating layer, the second insulating layer disposed on the first insulating layer and providing a third through hole connected to the second through hole and exposing the upper surface of the first semiconductor layer, and wherein the first electrode pad may be electrically connected to the first semiconductor layer through the second through hole and the third through hole.

The semiconductor device according to the embodiment may further comprise a first metal layer disposed in the second through hole, wherein the first metal layer may be in contact with a lower surface of the first electrode pad and an upper surface of the first semiconductor layer.

Advantageous Effects

According to the semiconductor device and the method of manufacturing the semiconductor device of the embodiments, there is an advantage that high power can be applied and high power light can be provided.

According to the semiconductor device and the method of manufacturing the semiconductor device of the embodiments, there is an advantage that a plurality of light emitting structures can be connected in series to prevent current concentration phenomenon from occurring, thereby improving reliability.

According to the semiconductor device and the method of manufacturing the semiconductor device of the embodiments, there is an advantage that the reflective electrode and the pad electrode can be arranged so as to be suitable for flip chip bonding method, thereby facilitating the bonding process and improving the light extraction efficiency by increasing the reflectance of the emitted light.

DESCRIPTION OF DRAWINGS

FIG. 1 is a plan view of a semiconductor device according to an embodiment of the present invention.

FIG. 2 is a cross-sectional view taken along line A-A of the semiconductor device shown in FIG. 1.

FIG. 3 is a cross-sectional view taken along line B-B of the semiconductor device shown in FIG. 1.

FIG. 4 is a view showing an example of a connection electrode applied to a semiconductor device according to an embodiment of the present invention.

FIGS. 5 to 11 are views illustrating a method of manufacturing a semiconductor device according to an embodiment of the present invention.

FIG. 12 is a view explaining a phenomenon in which current concentration occurs in a semiconductor device according to an embodiment of the present invention.

FIG. 13 is a plan view showing other examples of a semiconductor device according to an embodiment of the present invention.

FIG. 14 is a view explaining a shape of a light emitting structure applied to other examples of the semiconductor device shown in FIG. 13.

FIG. 15 is a view explaining a shape of a first insulating layer applied to other examples of the semiconductor device shown in FIG. 13.

FIG. 16 is a view explaining shapes of a first ohmic contact layer and a second ohmic contact layer applied to other examples of the semiconductor device shown in FIG. 13.

FIG. 17 is a view explaining shapes of a first reflective electrode and a second reflective electrode applied to other examples of the semiconductor device shown in FIG. 13.

FIG. 18 is a view explaining shapes of a connection electrode, a first metal layer, and a second metal layer applied to other examples of the semiconductor device shown in FIG. 13.

MODE FOR INVENTION

Hereinafter, embodiments will be described with reference to the accompanying drawings. In the description of the embodiments, in the case that each layer (film), region, pattern or structure may be referred to as provided "on/over" or "under" a substrate, each layer (film), region, pad, or pattern, the terms "on/over" and "under" include both "directly" and "indirectly interposed with another layer". In addition, "on/over" or "under" of each layer will be described based on the drawings, but the embodiments are not limited thereto.

Hereinafter, a semiconductor device according to an embodiment of the present invention and a method of manufacturing the semiconductor device will be described in detail with reference to the accompanying drawings.

First, a semiconductor device according to an embodiment of the present invention will be described with reference to FIGS. 1 and 2. FIG. 1 is a plan view showing the semiconductor device according to the embodiment of the present invention, and FIG. 2 is a cross-sectional view taken along line A-A of the semiconductor device shown in FIG. 1.

Meanwhile, in order to easily understand, in FIG. 1, a first bonding pad 171 and a second bonding pad 172 are processed in a transparent manner, and in order to facilitate the placement relationship between the components, a first insulating layer 161 and a second insulating layer 162 are omitted.

The semiconductor device according to the embodiment may comprise a first light emitting structure 110 and a second light emitting structure 120 disposed on a substrate 100, as shown in FIGS. 1 and 2. The first and second light emitting structures 110 and 120 may be spaced apart from each other on the substrate 100. A spacing S may be provided between a side of the first light emitting structure 110 and a side of the second light emitting structure 120 facing each other on an upper surface of the substrate 100. Accordingly, a lower side of the first light emitting structure 110 and a lower side of the second light emitting structure 120 which are in contact with the upper surface of the substrate 100 may be spaced apart from each other by the spacing S on the substrate 100.

The substrate 100 may be selected from a group including of a sapphire substrate ($Al_2O_3$), SiC, GaAs, GaN, ZnO, Si, GaP, InP and Ge. For example, the substrate 100 may be provided as a patterned sapphire substrate (PSS) having a concavo-convex pattern formed on an upper surface thereof.

The first light emitting structure 110 may comprise a first semiconductor layer 111, a first active layer 112, and a second semiconductor layer 113. The first active layer 112 may be disposed between the first semiconductor layer 111 and the second semiconductor layer 113. For example, the first active layer 112 may be disposed on the first semiconductor layer 111, and the second semiconductor layer 113 may be disposed on the first active layer 112.

According to the embodiment, the first semiconductor layer 111 may be provided as a first conductivity type semiconductor layer, and the second semiconductor layer 113 may be provided as a second conductivity type semiconductor layer. The first semiconductor layer 111 may be provided as an n-type semiconductor layer, and the second semiconductor layer 113 may be provided as a p-type semiconductor layer.

Of course, according to another embodiment, the first semiconductor layer 111 may be provided as a p-type semiconductor layer, and the second semiconductor layer 113 may be provided as an n-type semiconductor layer. Hereinafter, for convenience of description, the embodiment will be described based on that the first semiconductor layer 111 is provided as an n-type semiconductor layer and the second semiconductor layer 113 is provided as a p-type semiconductor layer.

The second light emitting structure 120 may comprise a third semiconductor layer 121, a second active layer 122, and a fourth semiconductor layer 123. The second active layer 122 may be disposed between the third semiconductor layer 121 and the fourth semiconductor layer 123. For example, the second active layer 122 may be disposed on the third semiconductor layer 121, and the fourth semiconductor layer 123 may be disposed on the second active layer 122.

According to the embodiment, the third semiconductor layer 121 may be provided as a first conductivity type semiconductor layer, and the fourth semiconductor layer 123 may be provided as a second conductivity type semiconductor layer. The third semiconductor layer 121 may be provided as an n-type semiconductor layer, and the fourth semiconductor layer 123 may be provided as a p-type semiconductor layer.

As described above, according to another embodiment, the third semiconductor layer 121 may be provided as a p-type semiconductor layer, and the fourth semiconductor layer 123 may be provided as an n-type semiconductor layer. Hereinafter, for convenience of description, the embodiment will be described based on that the third semiconductor layer 121 is provided as an n-type semiconductor layer and the fourth semiconductor layer 123 is provided as a p-type semiconductor layer for convenience of description.

In addition, in the above description, the case where the first semiconductor layer 111 and the third semiconductor layer 121 are disposed on and in contact with the substrate 100 has been described. However, a buffer layer may be further disposed between the first semiconductor layer 111 and the substrate 100, and between the third semiconductor layer 121 and the substrate 100. For example, the buffer layer may reduce the difference in lattice constant between the substrate 100 and the first and second light emitting structures 110 and 120, and may improve crystallinity.

The first light emitting structure 110 and the second light emitting structure 120 may be provided with a compound semiconductor. The first light emitting structure 110 and the second light emitting structure 120 may be provided with, for example, Group II-VI or Group II-V compound semiconductor. For example, the first and second light emitting structures 110 and 120 may comprise at least two or more elements selected from aluminum (Al), gallium (Ga), indium (In), phosphorus (P), arsenic (As), and nitrogen (N).

The first semiconductor layer 111 and the third semiconductor layer 121 may be provided with, for example, a Group II-VI compound semiconductor or a Group III-V compound semiconductor. For example, the first semiconductor layer 111 and the third semiconductor layer 121 may be provided with a semiconductor material having a composition formula of $In_xAl_yGa_{1-x-y}N$ ($0 \le x \le 1$, $0 \le y \le 1$, $0 \le x+y \le 1$) or a semiconductor material having a composition formula of $(Al_xGa_{1-x})_yIn_{1-y}P$ ($0 \le x \le 1$, $0 \le y \le 1$). For example, the first semiconductor layer 111 and the third semiconductor layer 121 may be independently selected from a group including GaN, AlN, AlGaN, InGaN, InN, InAlGaN, AlInN, AlGaAs, GaP, GaAs, GaAsP, AlGaInP, AlInP, GaInP, and the like, and an n-type dopant independently selected from a group including Si, Ge, Sn, Se, Te and the like may be doped.

The first active layer 112 and the second active layer 122 may be provided with, for example, a Group II-VI compound semiconductor or a Group III-V compound semiconductor. For example, the first active layer 112 and the second active layer 122 may be provided with a semiconductor material having a composition formula of $In_xAl_yGa_{1-x-y}N$ ($0 \le x \le 1$, $0 \le y \le 1$, $0 \le x+y \le 1$) or a semiconductor material having a composition formula of $(Al_xGa_{1-x})_yIn_{1-y}P$ ($0 \le x \le 1$, $0 \le y \le 1$).

For example, the first active layer 112 and the second active layer 122 may be independently selected from a group including GaN, AlN, AlGaN, InGaN, InN, InAlGaN, AlInN, AlGaAs, GaP, GaAs, GaAsP, AlGaInP, AlInP, GaInP, and the like. For example, the first active layer 112 and the second active layer 122 may be provided in a multi-well structure, and may comprise a plurality of barrier layers and a plurality of well layers.

The second semiconductor layer 113 and the fourth semiconductor layer 123 may be provided with, for example, Group II-VI compound semiconductor or Group III-V compound semiconductor. For example, the second semiconductor layer 113 and the fourth semiconductor layer 123 may be provided with a semiconductor material having a composition formula of $In_xAl_yGa_{1-x-y}N$ ($0 \le x \le 1$, $0 \le y \le 1$, $0 \le x+y \le 1$) or a semiconductor material having a composition formula of $(Al_xGa_{1-x})_yIn_{1-y}P$ ($0 \le x \le 1$, $0 \le y \le 1$). For example, the second semiconductor layer 113 and the fourth semiconductor layer 123 may be independently selected from a group including GaN, AlN, AlGaN, InGaN, InN, InAlGaN, AlInN, AlGaAs, GaP, GaAs, GaAsP, AlGaInP, AlInP, GaInP, and the like, and a p-type dopant independently selected from a group including Mg, Zn, Ca, Sr, Ba, and the like may be doped.

According to the embodiment, the first light emitting structure 110 may comprise a first through hole TH1. For example, the first light emitting structure 110 may comprise the first through hole TH1 passing through the second semiconductor layer 113 and the first active layer 112. The first through hole TH1 may pass through the second semiconductor layer 113 and the first active layer 112 to expose the first semiconductor layer 111. The first light emitting structure 110 may comprise a plurality of first through holes TH1. The formation of the first through hole TH1 will be described later while explaining a method of manufacturing a semiconductor device.

The semiconductor device according to the embodiment may comprise a first insulating layer 161. The first insulating layer 161 may be disposed on the first light emitting structure 110. The first insulating layer 161 may be disposed on the second light emitting structure 120. The first insulating layer 161 may be disposed on the upper surface of the substrate 100 exposed between the first and second light emitting structures 110 and 120.

The first insulating layer 161 may be disposed in the first through hole TH1 provided in the first light emitting structure 110 and provide a second through hole TH2. The first semiconductor layer 111 may be exposed by the second through hole TH2. An upper surface of the first semiconductor layer 111 may be exposed by the second through hole TH2. The first insulating layer 161 may be disposed on the second semiconductor layer 113 and expose an upper surface of the second semiconductor layer 113.

The first insulating layer 161 may comprise a contact region H1 exposing the second light emitting structure 120. The first insulating layer 161 may comprise a contact region H1 exposing an upper surface of the third semiconductor layer 121 of the second light emitting structure 120. The first insulating layer 161 may be disposed on the fourth semiconductor layer 123 and expose an upper surface of the fourth semiconductor layer 123.

For example, the first insulating layer 161 may be provided as an insulating material. For example, the first insulating layer 161 may be formed of at least one material selected from a group including $SiO_2$, $SiO_x$, $SiO_xN_y$, $Si_3N_4$, and $Al_2O_3$. In addition, the first insulating layer 161 may be formed of a Distributed Bragg Reflector (DBR).

The semiconductor device according to the embodiment may comprise a first reflective electrode 141 disposed on the first light emitting structure 110. For example, the first reflective electrode 141 may be disposed on the second semiconductor layer 113. The first reflective electrode 141 may be electrically connected to the second semiconductor layer 113.

The semiconductor device according to the embodiment may comprise a second reflective electrode 142 disposed on the second light emitting structure 120. For example, the second reflective electrode 142 may be disposed on the fourth semiconductor layer 123. The second reflective electrode 142 may be electrically connected to the fourth semiconductor layer 123.

The first reflective electrode 141 and the second reflective electrode 142 may comprise a metal, for example, and be formed of a material selected from a group including Ag, Ni, Al, Rh, Pd, Ir, Ru, Mg, Zn, Pt, Au, Hf, Ti, W, and those alloys. The first reflective electrode 141 and the second reflective electrode 142 may be formed of one layer or a plurality of layers. The first reflective electrode 141 and the second reflective electrode 142 may comprise, for example, Ag, Al, Au, and the like as a reflective metal, and Ni, Ti, TiW, Pt, and the like as a barrier metal. For example, the first reflective electrode 141 and the second reflective electrode 142 may be formed of an Ag/Ni/Ti layer.

The semiconductor device according to the embodiment may further comprise a first ohmic contact layer 131. The first ohmic contact layer 131 may be disposed on the second semiconductor layer 113. The first ohmic contact layer 131 may be disposed between the first light emitting structure 110 and the first reflective electrode 141. The first ohmic contact layer 131 may be disposed between the second semiconductor layer 113 and the first reflective electrode 141. The first ohmic contact layer 131 may be disposed under the first reflective electrode 141. A portion of the first ohmic contact layer 131 may be disposed on the first insulating layer 161.

A description has been made on the case where the first ohmic contact layer 131 is provided between the second semiconductor layer 113 and the first reflective electrode 141 in the description of the semiconductor device according to the embodiment. However, according to another embodiment, the first ohmic contact layer 131 may be omitted and the first reflective electrode 141 may be disposed on and directly contacted with the second semiconductor layer 113.

The semiconductor device according to the embodiment may further comprise a second ohmic contact layer 132. The second ohmic contact layer 132 may be disposed on the fourth semiconductor layer 123. The second ohmic contact layer 132 may be disposed between the second light emitting structure 120 and the second reflective electrode 142. The second ohmic contact layer 132 may be disposed between the fourth semiconductor layer 123 and the second reflective electrode 142. The second ohmic contact layer 132 may be disposed under the second reflective electrode 142. A portion of the second ohmic contact layer 132 may be disposed on the first insulating layer 161.

The description has been made on the case where the second ohmic contact layer 132 is provided between the fourth semiconductor layer 123 and the second reflective electrode 142 in describing the semiconductor device according to the embodiment. However, according to another embodiment, the second ohmic contact layer 132 may be omitted and the second reflective electrode 142 may disposed on and directly contact the fourth semiconductor layer 123.

For example, the first ohmic contact layer 131 and the second ohmic contact layer 132 may comprise at least one selected from a group including a metal, a metal oxide, and a metal nitride. The first ohmic contact layer 131 and the second ohmic contact layer 132 may comprise a transparent material.

For example, the first ohmic contact layer 131 and the second ohmic contact layer 132 may comprise at least one selected from a group including indium tin oxide (ITO), indium zinc oxide (IZO), IZO nitride (IZON), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, Ni/IrOx/Au/ITO, Pt, Ni, Au, Rh, and Pd.

The semiconductor device according to the embodiment may comprise a connection electrode 150. The connection electrode 150 may be electrically connected to the first light emitting structure 110. For example, the connection electrode 150 may be electrically connected to the second semiconductor layer 113 of the first light emitting structure 110. The connection electrode 150 may be electrically connected to the first reflective electrode 141. A portion of the connection electrode 150 may be disposed on an upper surface of the first reflective electrode 141. A portion of the connection electrode 150 may be disposed on the first ohmic contact layer 131.

In addition, the connection electrode 150 may be electrically connected to the second light emitting structure 120. For example, the connection electrode 150 may be electrically connected to the third semiconductor layer 121 of the second light emitting structure 120. The connection electrode 150 may be disposed in contact with an upper surface of the third semiconductor layer 121. The connection electrode 150 may be disposed on an upper surface of the third semiconductor layer 121 through the contact region H1 provided by the first insulating layer 161. The connection electrode 150 may be disposed between a side of the first light emitting structure 110 and a side of the second light emitting structure 120 facing each other. The connection electrode 150 may be electrically connected to the second semiconductor layer 113 and the third semiconductor layer 121.

For example, the connection electrode 150 may be disposed in contact with an upper surface of the third semiconductor layer 121 and an upper surface of the first reflective electrode 141. The connection electrode 150 may electrically connect the second semiconductor layer 113 and the third semiconductor layer 121 in series.

With reference to FIG. 1 to 4, in the semiconductor device according to the embodiment, the arrangement of the connection electrode 150 and the electrical connection between the first light emitting structure 110 and the second light emitting structure 120 will be described. FIG. 3 is a cross-sectional view taken along line B-B of FIG. 1, and FIG. 4 is a view illustrating an example of the connection electrode applied to the semiconductor device according to the embodiment of the present invention.

The connection electrode 150 according to the embodiment may comprise a main electrode 150*a*, a first branch electrode 150*b*, a second branch electrode 150*c*, and a third branch electrode 150*d*.

The connection electrode 150 may be electrically connected to the first light emitting structure 110 and the second light emitting structure 120. The first light emitting structure 110 and the second light emitting structure 120 may be electrically connected in series by the connection electrode 150.

The connection electrode 150 may comprise the main electrode 150*a*. The main electrode 150*a* may be disposed to overlap with the first light emitting structure 110 in a vertical direction. A portion of the main electrode 150*a* may be disposed to overlap with the first reflective electrode 141 in the vertical direction. A portion of the main electrode 150*a* may be disposed to overlap with an upper surface of the second semiconductor layer 113 in the vertical direction.

In addition, the main electrode 150*a* may be disposed to overlap with the second light emitting structure 120 in the vertical direction. A portion of the main electrode 150*a* may be disposed to overlap with the third semiconductor layer 121 in the vertical direction.

In addition, the main electrode 150*a* may be disposed between the first light emitting structure 110 and the second light emitting structure 120. The main electrode 150*a* may extend from an upper surface of the first semiconductor layer 111 of the first light emitting structure 110 to an upper surface of the third semiconductor layer 121 of the second light emitting structure 120.

The connection electrode 150 may further comprise the first branch electrode 150*b*, the second branch electrode 150*c*, and the third branch electrode 150*d*.

The first branch electrode 150*b* may extend from the main electrode 150*a*. The first branch electrode 150*b* may be disposed on the second light emitting structure 120. The first branch electrode 150*b* may be disposed on the third semiconductor layer 121. The first branch electrode 150*b* may be disposed in the contact region H1 provided by the first insulating layer 161. The first branch electrode 150*b* may be electrically connected to the third semiconductor layer 121 through the contact region H1 provided by the first insulating layer 161. The first branch electrode 150*b* may be disposed in contact with the upper surface of the third semiconductor layer 121 through the contact region H1 provided by the first insulating layer 161.

The second branch electrode 150*c* and the third branch electrode 150*d* may be disposed on the second light emitting structure 120. The second branch electrode 150*c* and the third branch electrode 150*d* may be disposed on an upper surface of the third semiconductor layer 121. The second branch electrode 150*c* and the third branch electrode 150*d* may extend from the first branch electrode 150*b*. For example, the second branch electrode 150*c* may extend from an end of the first branch electrode 150*b*, and the third branch electrode 150*d* may extend from another end of the first branch electrode 150*b*. The second branch electrode 150*c* and the third branch electrode 150*d* may be disposed on both sides of the second light emitting structure 120, respectively.

The second branch electrode 150*c* and the third branch electrode 150*d* may be electrically connected to the third semiconductor layer 121 through the contact region H1 provided by the first insulating layer 161. The second branch electrode 150*c* and the third branch electrode 150*d* may be in contact with the upper surface of the third semiconductor layer 121 through the contact region H1 provided by the first insulating layer 161.

For example, the connection electrode 150 may be formed of a material selected from a group including Ag, Ni, Al, Rh, Pd, Ir, Ru, Mg, Zn, Pt, Au, Hf, Ti, W, Cr, and those alloys. The connection electrode 150 may be formed of one layer or a plurality of layers. The connection electrode 150 may comprise, for example, a plurality of metal layers as a reflective metal, and Cr or Ti as an adhesive layer. For example, the connection electrode 150 may be formed of a Cr/Al/Ni/Au/Ti layer.

The semiconductor device according to the embodiment may comprise a first metal layer 151. The first metal layer 151 may be disposed on the first light emitting structure 110. The first metal layer 151 may be disposed on the first semiconductor layer 111. The first metal layer 151 may be electrically connected to the first semiconductor layer 111. The first metal layer 151 may be disposed in the second through hole TH2 provided by the first insulating layer 161. The first metal layer 151 may be disposed on and in contact with an upper surface of the first semiconductor layer 111.

The semiconductor device according to the embodiment may comprise a second metal layer 152. The second metal layer 152 may be disposed on the second light emitting structure 120. The second metal layer 152 may be disposed on the fourth semiconductor layer 123. The second metal layer 152 may be disposed on the second reflective electrode 142. The second metal layer 152 may be electrically connected to the second reflective electrode 142. The second metal layer 152 may be electrically connected to the fourth semiconductor layer 123 through the second reflective electrode 142.

In the above description, the case where the second metal layer 152 is disposed on the second reflective electrode 142 has been described. However, according to the semiconductor device according to another embodiment, the formation of the second metal layer 152 may be omitted.

For example, the first metal layer 151 and the second metal layer 152 may be formed together in the process of forming the connection electrode 150. The first metal layer 151 and the second metal layer 152 may be formed of a material selected from a group including Ag, Ni, Al, Rh, Pd, Ir, Ru, Mg, Zn, Pt, Au, Hf, Ti, Cr, and those alloys. The first metal layer 151 and the second metal layer 152 may be formed of one layer or a plurality of layers. For example, the first metal layer 151 and the second metal layer 152 may comprise a plurality of metal layers as reflective metals, and Cr or Ti, and the like as an adhesive layer. For example, the first metal layer 151 and the second metal layer 152 may be formed of a Cr/Al/Ni/Au/Ti layer.

The semiconductor device according to the embodiment may comprise a second insulating layer 162. The second insulating layer 162 may be disposed on the first light emitting structure 110. The second insulating layer 162 may be disposed on the second light emitting structure 120. The second insulating layer 162 may be disposed on the first reflective electrode 141. The second insulating layer 162 may be disposed on the second reflective electrode 142. The second insulating layer 162 may be disposed on the connection electrode 150. The second insulating layer 162 may be disposed on the first metal layer 151 and may provide a third through hole TH3. An upper surface of the first metal layer 151 may be exposed by the third through hole TH3. The second insulating layer 162 may be disposed on the second metal layer 152 and may expose an upper surface of the second metal layer 152.

For example, the second insulating layer 162 may be provided as an insulating material. For example, the second insulating layer 162 may be formed of at least one material selected from a group including $SiO_2$, $SiO_x$, $SiO_xN_y$, $Si_3N_4$, and $Al_2O_3$. In addition, the second insulating layer 162 may be formed of a Distributed Bragg Reflector (DBR). According to the embodiment, since the second insulating layer 162 is provided as the DBR, light generated from the first active layer 112 and the second active layer 122 is efficiently reflected and extracted to the outside. For example, the second insulating layer 162 may be provided as a DBR layer formed by stacking $SiO_2$ and $TiO_2$ as a plurality of layers.

The semiconductor device according to the embodiment may comprise a first electrode pad 171 and a second electrode pad 172. The first electrode pad 171 may be disposed on the first light emitting structure 110. The second electrode pad 172 may be disposed on the second light emitting structure 120.

The first electrode pad 171 may be electrically connected to the first semiconductor layer 111. A lower surface of the first electrode pad 171 may be in contact with an upper surface of the first metal layer 151. The first electrode pad 171 may be electrically connected to the first semiconductor layer 111 through the first metal layer 151. A portion of the first electrode pad 171 may be disposed in the third through hole TH3 and be electrically connected to the first metal layer 151.

The second electrode pad 172 may be electrically connected to the second reflective electrode 142. The second electrode pad 172 may be disposed on the second metal layer 152. The second electrode pad 172 may be electrically connected to the second reflective electrode 142 through the second metal layer 152.

In the embodiment, the case where the second metal layer 152 is disposed between the second electrode pad 172 and the second reflective electrode 142 has been described. However, according to another embodiment, the second metal layer 152 may not be formed, and the second electrode pad 172 and the second reflective electrode 142 may be in direct contact with each other.

According to the embodiment, the first light emitting structure 110 and the second light emitting structure 120 may emit light when power is applied to the first electrode pad 171 and the second electrode pad 172. The first light emitting structure 110 and the second light emitting structure 120 may be electrically connected in series and be operated by applying a power to the first electrode pad 171 and the second electrode pad 172. For example, the second electrode pad 172, the fourth semiconductor layer 123, the third semiconductor layer 121, the connection electrode 150, the second semiconductor layer 113, the first semiconductor layer 111, and the first electrode pad 171 may be electrically connected in series.

The semiconductor device according to the embodiment may be connected to an external power source in a flip chip bonding manner. For example, in manufacturing the semiconductor device package, an upper surface of the first electrode pad 171 and an upper surface of the second electrode pad 172 may be disposed to be attached to the circuit board. When the semiconductor device according to the embodiment is attached to a circuit board by a flip chip bonding method, light provided from the first and second light emitting structures 110 and 120 may be emitted through the substrate 100. Light emitted from the first light emitting structure 110 may be reflected by the first reflective electrode 141 and emitted toward the substrate 100. In addition, light emitted from the second light emitting structure 120 may be reflected by the second reflective electrode 142 and emitted toward the substrate 100.

As described above, according to the semiconductor device of the embodiment, the first reflective electrode 141 having a size corresponding to the light emitting area of the first light emitting structure 110 is disposed on the first light emitting structure 110. The second reflective electrode 142 having a size corresponding to the light emitting area of the second light emitting structure 120 is disposed on the second light emitting structure 120. Accordingly, light emitted from the first and second light emitting structures 110 and 120 can be efficiently reflected by the first and second reflective electrodes 141 and 142, and be provided toward the substrate 100.

In addition, according to the semiconductor device and the semiconductor device package of the embodiment, since the first electrode pad 171 and the second electrode pad 172 having large areas can be directly bonded to the circuit board providing power, flip chip bonding process can be performed easily and stably.

According to the semiconductor device and the semiconductor device package of the embodiment, it is possible to provide a flip chip bonding type semiconductor device that can be applied to products requiring high voltage and high output.

Meanwhile, in the above description, the case where the semiconductor device according to the embodiment is electrically connected to the circuit board by the flip chip bonding method has been described. However, according to another embodiment, power may be supplied to the first electrode pad 171 and the second electrode pad 172 by a die bonding method or a wire bonding method.

Then, a method of manufacturing a semiconductor device according to an embodiment will now be described with reference to FIGS. 5 to 11. In explaining the method of manufacturing the semiconductor device according to the embodiment with reference to FIGS. 5 to 11, descriptions overlapping with those described with reference to FIGS. 1 to 4 may be omitted.

According to the method of manufacturing the semiconductor device of the embodiment, referring to FIG. 5, a first light emitting structure 110 and a second light emitting structure 120 may be formed on a substrate 100. The (a) of FIG. 5 is a cross-sectional view showing a process of the semiconductor device taken along line A-A shown in FIG. 1, the (b) of FIG. 5 is a view explaining a mesa etching for a grown semiconductor layer, the (c) of FIG. 5 is a view explaining isolation etching for a mesa etched semiconductor layer.

According to the embodiment, a semiconductor layer may be grown on the substrate 100. Mesa etching may be performed on the grown semiconductor layer using a mask having a shape shown in the (b) of FIG. 5. The first light emitting structure 110 and the second light emitting structure 120 may be formed by the mesa etching. Also, a first through hole TH1 may be formed in the first light emitting structure 110. A stepped region may be formed on a side surface of the first semiconductor layer 111 of the first light emitting structure 110, and a lower region and an upper region may be divided by the stepped region. In addition, a stepped region may be formed on a side surface of the third semiconductor layer 121 of the second light emitting structure 120, and a lower region and an upper region may be divided by the stepped region.

Then, isolation etching may be performed using a mask having a shape shown in the (c) of FIG. 5. An upper surface of the substrate 100 may be exposed between the first and second light emitting structures 110 and 120 by the isolation etching.

Next, as shown in FIG. 6, a first insulating layer 161 may be formed on the first and second light emitting structures 110 and 120. The (a) of FIG. 6 is a cross-sectional view showing a sequential process of the semiconductor device taken along line A-A shown in FIG. 1, and the (b) of FIG. 6 is a view explaining a process of forming the first insulating layer.

According to the embodiment, the first insulating layer 161 may be formed in a shape shown in the (b) of FIG. 6 through a photolithography process using a mask. The first insulating layer 161 may be disposed in the first through hole TH1 provided in the first light emitting structure 110 and provide a second through hole TH2. The first semiconductor layer 111 may be exposed by the second through hole TH2. An upper surface of the first semiconductor layer 111 may be exposed by the second through hole TH2. The first insulating layer 161 may be disposed on the second semiconductor layer 113 to expose a portion of the upper surface of the second semiconductor layer 113.

The first insulating layer 161 may comprise a contact region H1 exposing the second light emitting structure 120. The first insulating layer 161 may comprise the contact region H1 that exposes an upper surface of the third semiconductor layer 121 of the second light emitting structure 120. The first insulating layer 161 may be disposed on the fourth semiconductor layer 123 to expose a portion of the upper surface of the fourth semiconductor layer 123.

As shown FIG. 7, a first ohmic contact layer 131 may be formed on the first light emitting structure 110 and a second ohmic contact layer 132 may be formed on the second light emitting structure 120. The (a) of FIG. 7 is a cross-sectional view showing a sequential process of the semiconductor device taken along line A-A shown in FIG. 1, and the (b) of FIG. 7 is a view explaining a process of forming the first ohmic contact layer and the second ohmic contact layer.

According to the embodiment, the first ohmic contact layer 131 and the second ohmic contact layer 132 may be formed of the shape shown in the (b) of FIG. 7. For example, the first ohmic contact layer 131 may be formed on the second semiconductor layer 113. The second ohmic contact layer 132 may be formed on the fourth semiconductor layer 123.

Next, as shown in FIG. 8, a first reflective electrode 141 and a second reflective electrode 142 may be formed. The (a) of FIG. 8 is a cross-sectional view showing a sequential process of the semiconductor device taken along line A-A shown in FIG. 1, and the (b) of FIG. 8 is a view explaining a process of forming the first reflective electrode and the second reflective electrode.

According to the embodiment, the first reflective electrode 141 and the second reflective electrode 142 may be formed of the shape shown in the (b) of FIG. 8. For example, the first reflective electrode 141 may be disposed on the second semiconductor layer 113. The first reflective electrode 141 may be disposed on the first ohmic contact layer 131. The second reflective electrode 142 may be disposed on the fourth semiconductor layer 123. The second reflective electrode 142 may be disposed on the second ohmic contact layer 132.

As shown in FIG. 9, a connection electrode 150 may be formed. The (a) of FIG. 9 is a cross-sectional view of showing a sequential process of the semiconductor device taken along line A-A shown in FIG. 1, and the (b) of FIG. 9 is a view explaining a process for forming the connection electrode.

According to the embodiment, the connection electrode 150 may be formed of the shape shown in the (b) of FIG. 9. The connection electrode 150 may comprise a main electrode 150a, a first branch electrode 150b, a second branch electrode 150c, and a third branch electrode 150c.

The connection electrode 150 may be electrically connected to the first light emitting structure 110 and the second light emitting structure 120. The first light emitting structure 110 and the second light emitting structure 120 may be electrically connected in series by the connection electrode 150.

The connection electrode 150 may comprise the main electrode 150a. The main electrode 150a may be disposed to overlap with the first light emitting structure 110 in the vertical direction. A portion of the main electrode 150a may be disposed to overlap with the first reflective electrode 141 in the vertical direction. A portion of the main electrode 150a may be disposed to overlap with an upper surface of the second semiconductor layer 113 in the vertical direction.

In addition, the main electrode 150a may be disposed to overlap with the second light emitting structure 120 in the vertical direction. A portion of the main electrode 150a may be disposed to overlap with the third semiconductor layer 121 in the vertical direction.

In addition, the main electrode 150a may be disposed between the first and second light emitting structures 110 and 120. The main electrode 150a may be disposed to extend from an upper surface of the first semiconductor layer 111 of the first light emitting structure 110 to an upper surface of the third semiconductor layer 121 of the second light emitting structure 120.

The first branch electrode 150b may extend from the main electrode 150a. The first branch electrode 150b may be disposed on the second light emitting structure 120. The first branch electrode 150b may be disposed on the third semiconductor layer 121. The first branch electrode 150b may be disposed in the contact region H1 provided by the first insulating layer 161. The first branch electrode 150b may be electrically connected to the third semiconductor layer 121 through the contact region H1 provided by the first insulating layer 161. The first branch electrode 150b may be disposed in contact with an upper surface of the third semiconductor layer 121 through the contact region H1 provided by the first insulating layer 161.

The second branch electrode 150c and the third branch electrode 150d may be disposed on the second light emitting structure 120. The second branch electrode 150c and the third branch electrode 150d may be disposed on an upper surface of the third semiconductor layer 121. The second branch electrode 150c and the third branch electrode 150d may extend from the first branch electrode 150b. For example, the second branch electrode 150c may extend from an end of the first branch electrode 150b, and the third branch electrode 150d may extend from another end of the first branch electrode 150b. The second branch electrode 150c and the third branch electrode 150d may be disposed on both sides of the second light emitting structure 120, respectively.

At this time, a first metal layer 151 and a second metal layer 152 may be formed together when the connection electrode 150 is formed.

The first metal layer 151 may be disposed on the first light emitting structure 110. The first metal layer 151 may be disposed on the first semiconductor layer 111. The first metal layer 151 may be electrically connected to the first semiconductor layer 111. The first metal layer 151 may be disposed in the second through hole TH2 provided by the first insulating layer 161. The first metal layer 151 may be disposed in contact with an upper surface of the first semiconductor layer 111.

The second metal layer 152 may be disposed on the second light emitting structure 120. The second metal layer 152 may be disposed on the fourth semiconductor layer 123. The second metal layer 152 may be disposed on the second reflective electrode 142.

Then, as shown in FIG. 10, a second insulating layer 162 may be formed. The (a) of FIG. 10 is a cross-sectional view showing a sequential process of the semiconductor device taken along line A-A shown in FIG. 1, and the (b) of FIG. 10 is a view explaining a process of forming the second insulating layer.

According to the embodiment, the second insulating layer 162 may be formed of the shape shown in the (b) of FIG. 10 through a photolithography process using a mask. The second insulating layer 162 may be disposed on the first light emitting structure 110. The second insulating layer 162 may be disposed on the second light emitting structure 120. The second insulating layer 162 may be disposed on the first reflective electrode 141. The second insulating layer 162 may be disposed on the second reflective electrode 142. The second insulating layer 162 may be disposed on the connection electrode 150. The second insulating layer 162 may be disposed on the first metal layer 151 and provide a third through hole TH3. An upper surface of the first metal layer 151 may be exposed by the third through hole TH3. The second insulating layer 162 may be disposed on the second metal layer 152 and expose an upper surface of the second metal layer 152.

Next, as shown in FIG. 11, a first electrode pad 171 and a second electrode pad 172 may be formed. The (a) of FIG. 11 is a cross-sectional view showing a sequential process of the semiconductor device taken along line A-A shown in FIG. 1, and the (b) of FIG. 11 is a view explaining a process of forming the first electrode pad and the second electrode pad.

According to the embodiment, the first electrode pad 171 and the second electrode pad 172 may be formed of the shape shown in the (b) of FIG. 11. The first electrode pad 171 may be disposed on the first light emitting structure 110. The second electrode pad 172 may be disposed on the second light emitting structure 120.

A lower surface of the first electrode pad 171 may be in contact with an upper surface of the first metal layer 151. A portion of the first electrode pad 171 may be disposed in the third through hole TH3 to contact the first metal layer 151.

The second electrode pad 172 may be disposed on the second metal layer 152. The second electrode pad 172 may be electrically connected to the second reflective electrode 142. The second electrode pad 172 may be electrically connected to the second reflective electrode 142 through the second metal layer 152.

For example, the first electrode pad 171 and the second electrode pad 172 may be formed of a material selected from a group including Ag, Ni, Al, Rh, Pd, Ir, Ru, Mg, Zn, Pt, Au, Hf, Ti, W, Cr, Cu, and those alloys. The first electrode pad 171 and the second electrode pad 172 may be formed of one layer or a plurality of layers.

The first electrode pad 171 and the second electrode pad 172 may comprise a diffusion barrier metal such as Cr, Cu, and the like to prevent Sn diffusion, for example, from solder bonding. For example, the first electrode pad 171 and the second electrode pad 172 may be formed of a Ti/Ni/Ti/Ni/Cu/Ni/Cr/Cr/Ni/Au layer. At this time, the Ni layer disposed beside the Cu layer can function as a barrier metal against Cu.

According to the embodiment, the first light emitting structure 110 and the second light emitting structure 120 may emit light when power is applied to the first electrode pad 171 and the second electrode pad 172. The first light emitting structure 110 and the second light emitting structure 120 may be electrically connected in series by a power applied to the first electrode pad 171 and the second electrode pad 172. For example, the second electrode pad 172, the fourth semiconductor layer 123, the third semiconductor layer 121, the connection electrode 150, the second semiconductor layer 113, the first semiconductor layer 111, and the first electrode pad 171 may be electrically connected in series.

The semiconductor device according to the embodiment may be connected to an external power source in a flip chip bonding manner. For example, an upper surface of the first electrode pad 171 and an upper surface of the second electrode pad 172 may be arranged to be attached to a circuit board. When the semiconductor device according to the embodiment is attached to a circuit board by a flip chip bonding method, light provided from the first and second light emitting structures 110 and 120 may be emitted through the substrate 100. Light emitted from the first light emitting structure 110 may be reflected by the first reflective electrode 141 and emitted toward the substrate 100. In addition, the light emitted from the second light emitting structure 120 may be reflected by the second reflective electrode 142 and emitted toward the substrate 100. According to the embodiment, the second insulating layer 162 may be provided as a Distributed Bragg Reflector (DBR) to improve the reflection efficiency, so light emitted from the first and second light emitting structures 110 and 120 can be efficiently extracted toward the substrate 100.

As described above, according to the semiconductor device of the embodiment, the first reflective electrode 141 having a size corresponding to the light emitting area of the first light emitting structure 110 is disposed on the first light emitting structure 110. Also, the second reflective electrode 142 having a size corresponding to the light emitting area of the second light emitting structure 120 is disposed on the second light emitting structure 120. Accordingly, light emitted from the first and second light emitting structures 110 and 120 can be efficiently reflected by the first and second reflective electrodes 141 and 142, and can be provided toward the substrate 100.

In addition, according to the semiconductor device of the embodiment, the first electrode pad 171 having a large area corresponding to the area of the first light emitting structure 110 and the second electrode pad 172 corresponding to the area of the second light emitting structure 120 can be directly bonded to a circuit board that provides power, so that the flip chip bonding process can be performed easily and stably.

The semiconductor device and the method of manufacturing the semiconductor device according to the embodiment can provide a flip chip bonding type semiconductor device and a method of manufacturing a semiconductor device that can be applied to products requiring high voltage and high output.

Meanwhile, the semiconductor device described with reference to FIGS. 1 to 11 may be applied with a high voltage in order to realize a high output. Accordingly, a high current flows through the first light emitting structure 110 and the second light emitting structure 120. According to the embodiment, negative power may be supplied to the first electrode pad 171 disposed on the first light emitting structure 110 and positive power may be supplied to the second electrode pad 172 disposed on the second light emitting structure 120.

When a high current of for example, 200 milliamperes or more flows in the semiconductor device according to the embodiment, as shown in FIG. 12, a current crowding phenomenon may occur at some regions in a case where a current flows from the third semiconductor layer 121 to the connection electrode 150. FIG. 12 is a view explaining a phenomenon in which current concentration occurs in the semiconductor device according to the embodiment of the present invention.

For example, as shown in FIG. 12, current crowding may be generated in a region where the third semiconductor layer 121 and the first branch electrode 150b are connected. Accordingly, a portion of the connection electrode 150 disposed in the region where the current crowding phenomenon occurs can be damaged or separated, which can adversely affect the reliability of the semiconductor device.

Various examples of the semiconductor device according to the embodiment that can solve the problem of the current concentration phenomenon described above are shown in FIG. 13. FIG. 13 is a plan view showing other examples of a semiconductor device according to an embodiment of the present invention. Referring to FIG. 13, in the description of the semiconductor device according to the embodiment, description overlapping with those described with reference to FIGS. 1 to 1 may be omitted.

The semiconductor device shown in the (a) of FIG. 13 is the semiconductor device according to the embodiment described with reference to FIGS. 1 to 11, and the semiconductor devices shown in the (b) to the (f) of FIG. 13 are semiconductor devices proposed as a method for overcoming the disadvantage of the semiconductor device shown in the (a) of FIG. 13. It has been confirmed that the current crowding phenomenon described with reference to FIG. 12 does not occur in the semiconductor devices shown in the (b) to the (f) of FIG. 13. The semiconductor devices according to embodiments are shown together in one figure so that the differences between the semiconductor devices according to each embodiment can be compared well.

Hereinafter, the difference between the semiconductor devices shown in the (b) to the (f) of FIG. 13 in comparison with the semiconductor device shown in the (a) of FIG. 13 will be described. The difference between the respective semiconductor devices will be described with reference to FIGS. 14 to 18 on the basis of the differences in the respective process steps. Each of the process steps shown in FIGS. 14 to 18 may correspond to the process steps described with reference to FIGS. 5 to 9.

FIG. 14 is a view explaining a shape of a light emitting structure applied to each semiconductor device, FIG. 15 is a view explaining a shape of a first insulating layer applied to each semiconductor device, FIG. 16 is a view explaining shapes of a first ohmic contact layer and a second ohmic contact layer, FIG. 17 is a view explaining shapes of a first reflective electrode and a second reflective electrode applied to each semiconductor device, and FIG. 18 is a view explaining a shape of a connection electrode applied to each semiconductor device.

First, the semiconductor device Q2 shown in the (b) of FIG. 13 differs from the semiconductor device Q1 shown in the (a) of FIG. 13 in the arrangement of the connection electrode 150. The semiconductor device Q2 shown in the (b) of FIG. 13 differs from the semiconductor device Q1 shown in the (a) of FIG. 13 in a length of the connection electrode 150. The semiconductor device Q2 shown in the (b) of FIG. 13 is formed so that a length of the second branch electrode 150c and a length of the third branch electrode 150d are longer than those of the semiconductor device Q1 shown in the (a) of FIG. 13. That is, in the semiconductor device Q2 shown in the (b) of FIG. 13, the second branch electrode 150c and the third branch electrode 150d extend from the first branch electrode 150b to an end region of the second light emitting structure 120 along an upper surface of the third semiconductor layer 121. In comparison, in the semiconductor device Q1 shown in the (a) of FIG. 13, the second branch electrode 150c and the third branch electrode 150d do not extend from the first branch electrode 150b to an end region of the second light emitting structure 120 along an upper surface of the third semiconductor layer 121 as a long length, and but just extend from the first branch electrode 150b to a middle region of the second light emitting structure 120 along the upper surface of the third semiconductor layer 121 as a short length. According to the semiconductor device Q2, as shown in the (b) of FIG. 13, by forming the second branch electrode 150c and the third branch electrode 150d to be sufficiently long, a region in which a current flows from the third semiconductor layer 211 to the connection electrode 150 can be enlarged and it is interpreted that the current can be spread accordingly.

For example, in the semiconductor device Q2 according to the embodiment, when the length of the second branch electrode 150c and the length of the third branch electrode 150d, which are arranged along the upper surface of the third semiconductor layer 121, are longer than 85% to 90% of the side length L of the third semiconductor layer 121, a phenomenon of current crowding can be improved. The side length L of the third semiconductor layer 121 indicates the length of the third semiconductor layer 121 provided corresponding to the direction in which the second branch electrode 150c is extended.

Then, with reference to FIGS. 14 to 18, the difference between the semiconductor device Q1 shown in the (a) of FIG. 13 and the semiconductor device Q2 shown in the (b) of FIG. 14 will be described at the process steps.

In the semiconductor device Q2 shown in the (b) of FIG. 13, as shown in the (a) and the (b) of FIG. 18, the second branch electrode 150c and the third branch electrode 150d are formed longer than the semiconductor device Q1. For this purpose, the shape of the light emitting structure of the semiconductor device Q2 shown in the (b) of FIG. 14 is formed differently from the shape of the light emitting structure of the semiconductor device Q1 shown in the (a) of FIG. 14. At this time, the first light emitting structures 110 may have the same shape, and the second light emitting structures 120 may have different shapes. In the case of the semiconductor device Q2, considering that the second branch electrode 150c and the third branch electrode 150d are formed to be longer than the semiconductor device Q1, unlike the semiconductor device Q1, the mesa etching region is formed in a linear shape without a protruding region in an end region of the side surface of the second light emitting structure 120.

In addition, in the case of the semiconductor device Q2, it is possible to see that the shape of the first insulating layer 161 shown in the (b) of FIG. 15, the shapes of the first ohmic contact layer 131 and the second ohmic contact layer 132 shown in the (b) of FIG. 16, and the shapes of the first reflective electrode 141 and the second reflective electrode 142 shown in the (b) of FIG. 17 are modified to be corresponded to the modified shapes, as described above, of the second light emitting structure 120 and the connection electrode 150.

Meanwhile, the semiconductor device Q3 shown in the (c) of FIG. 13 differs from the semiconductor device Q1 shown in the (a) of FIG. 13 in the arrangement of the connection electrode 150. The semiconductor device Q3 shown in the (c) of FIG. 13 differs from the semiconductor device Q1 shown in the (a) of FIG. 13 in the length of the connection electrode 150. The semiconductor device Q3 shown in the (c) of FIG. 13 is formed so that the length of the second branch electrode 150c and the length of the third branch electrode 150d are longer than those of the semiconductor device Q1 shown in the (a) of FIG. 13. That is, in the semiconductor device Q2 shown in the (c) of FIG. 13, the second branch electrode 150c and the third branch electrode 150d extend from the first branch electrode 150b to an end region of the second light emitting structure 120 along an upper surface of the third semiconductor layer 121. In comparison, in the semiconductor device Q1 shown in the (a) of FIG. 13, the second branch electrode 150c and the third branch electrode 150d do not extend from the first branch electrode 150b to an end region of the second light emitting structure 120 along an upper surface of the third semiconductor layer 121 as a long length, and but just extend from the first branch electrode 150b to a middle region of the second light emitting structure 120 along the upper surface of the third semiconductor layer 121 as a short length. According to the semiconductor device Q3, by forming the second branch electrode 150c and the third branch electrode 150d to be sufficiently long, a region in which a current flows from the third semiconductor layer 211 to the connection electrode 150 can be enlarged.

For example, in the semiconductor device Q3 according to the embodiment, when the length of the second branch electrode 150c and the length of the third branch electrode 150d, which are arranged along the upper surface of the third semiconductor layer 121, are longer than 85% to 90% of the side length L of the third semiconductor layer 121, a phenomenon of current crowding can be improved.

In addition, the semiconductor device Q3 according to the embodiment may further comprise a fourth branch electrode 150e connected to the second branch electrode 150c and the third branch electrode 150d. Accordingly, the first branch electrode 150b, the second branch electrode 150c, the third branch electrode 150d, and the fourth branch electrode 150e may be disposed around the second light emitting structure 120 to form a closed loop. According to the semiconductor device Q3 of the embodiment, by forming the second branch electrode 150c and the third branch electrode 150d to be sufficiently long, and by further forming the fourth branch electrode 150d, a region in which a current flows from the third semiconductor layer 211 to the connection electrode 150 can be enlarged and it is interpreted that the current can be spread sufficiently.

In the semiconductor device Q3 shown in the (c) of FIG. 13, as shown in the (a) and the (c) of FIG. 18, the second branch electrode 150c and the third branch electrode 150d are formed longer than the semiconductor device Q1. For this purpose, there is a difference in the shape of the light emitting structure of the semiconductor device Q1 and the shape of the light emitting structure of the semiconductor device Q3, as shown in the (a) and the (c) of FIG. 14. At this time, the first light emitting structures 110 may have the same shape, and the second light emitting structures 120 may have different shapes. In the case of the semiconductor device Q3, considering that the second branch electrode 150c and the third branch electrode 150d are formed to be longer than the semiconductor device Q1, unlike the semiconductor device Q1, the mesa etching region is formed in a linear shape without a protruding region in an end region of the side surface of the second light emitting structure 120. In addition, in the case of the semiconductor device Q3, considering that the fourth branch electrode 150e is further formed, unlike the semiconductor device Q1, the mesa etching region of the second light emitting structure 120 is enlarged.

In addition, in the case of the semiconductor device Q3, it is possible to see that the shape of the first insulating layer 161 shown in the (c) of FIG. 15, the shapes of the first ohmic contact layer 131 and the second ohmic contact layer 132 shown in the (c) of FIG. 15, and the shapes of the first reflective electrode 141 and the second reflective electrode 142 shown in the (c) of FIG. 17 are modified to be corresponded to the above description.

Meanwhile, the semiconductor device Q4 shown in the (d) of FIG. 13 differs from the semiconductor device Q1 shown in the (a) of FIG. 13 in the electrical connection between the connection electrode 150 and the third semiconductor layer 121. As shown in the (d) of FIG. 15, the semiconductor device Q4 is provided in point contact with the electrical connection between the connection electrode 150 and the third semiconductor layer 121. That is, as shown in the (a) of FIG. 15, in the case of the semiconductor device Q1, a contact region H1 exposing the third semiconductor layer 121 is provided in a linear shape. However, as shown in the (d) of FIG. 15, in the case of the semiconductor device Q4, the contact region H1 exposing the third semiconductor layer 121 may be provided in a plurality of holes.

Thus, according to the semiconductor device Q4 of the embodiment, the electrical connection between the connection electrode 150 provided in the contact region H1 and the third semiconductor layer 121 can be provided in point contact. That is, each of the electrical connection between the first branch electrode 150b and the third semiconductor layer 121, the electrical connection between the second branch electrode 150c and the third semiconductor layer 121, and the electrical connection between the third branch electrode 150d and the third semiconductor layer 121 may be provided in point contact.

According to the semiconductor device Q4 of the embodiment, the connection electrode 150 and the third semiconductor layer 121 can be in contact with each other through the contact region H1. At this time, when a strong current is injected through the hole pattern, an electric current passes through the narrow region, so that electrons passing in a direction perpendicular to the diameter of the contact region H1 are also present, but there is an effect that electrons are moved and spread in the circumferential direction of the contact region H, parallel to the diameter of the contact region H1.

As described above, according to the semiconductor device Q4 of the embodiment, since the electrical connection between the connection electrode 150 and the third semiconductor layer 121 is provided in point contact, it is interpreted that the first insulating layer 161 has a function as a kind of current blocking layer, and the current spread is effectively performed.

In addition, according to the semiconductor device Q4 of the embodiment, an Omnidirectional Reflector (ODR) effect can be generated. Since a metal layer has an extinction coefficient K, some loss occurs when light enters the metal layer. However, in the case of a dielectric, when the angle of incidence exceeds the critical angle due to the difference in refractive index, a phenomenon occurs in which light is totally reflected. According to the embodiment, some light loss may be generated with respect to light incident on the metal layer exposed by the contact region H1, however, when light is incident on the first insulating layer 161 providing the contact region H1, since part of the light is totally reflected, an advantage of minimizing the light loss is also provided.

At this time, the diameter of the hole providing the contact region H1 may be, for example, 5 micrometers to 50 micrometers. If the diameter of the hole is smaller than 5 micrometers, the passage may be too small to limit the flow of current. Further, when the diameter of the hole is larger than 50 micrometers, the current spreading effect due to the hole contact can be reduced.

Meanwhile, the semiconductor device Q5 shown in the (e) of FIG. 13 differs from the semiconductor device Q1 shown in the (a) of FIG. 13 in electrical connection between the connection electrode 150 and the third semiconductor layer 121. As shown in the (e) of FIG. 15, the semiconductor device Q5 has a difference in electrical connection positions between the connection electrode 150 and the third semiconductor layer 121. As shown in the (a) of FIG. 15 and the (a) of FIG. 18, in the semiconductor device Q1, a first branch electrode 150b, a second branch electrode 150c, and a third branch electrode 150d are electrically connected to the third semiconductor layer 121 through the contact region H1. However, in the semiconductor device Q5 according to the embodiment, as shown in the (e) of FIG. 15 and the (e) of FIG. 18, the second branch electrode 150c and the third branch electrode 150d are electrically connected to the third semiconductor layer through the contact region H1.

That is, in the semiconductor device Q5 according to the embodiment, the contact region is not provided in the region of the first insulating layer 161 disposed under the first branch electrode 150b, as shown in the (e) of FIG. 15. Therefore, according to the semiconductor device Q5 of the embodiment, the electrical connection between the first branch electrode 150b and the third semiconductor layer 121, in which the current crowding phenomenon occurs in the semiconductor device Q1, is not provided. Accordingly, since the electrical connection between the second branch electrode 150c and the third semiconductor layer 121 and the electrical connection between the third branch electrode 150d and the third semiconductor layer 121 are provided, in the semiconductor device Q5 of the embodiment, the current crowding phenomenon between the first branch electrode 150b and the third semiconductor layer 121 can be prevented.

In addition, according to the semiconductor device Q5 of the embodiment, when the mesa etching is performed on the second light emitting structure 120, it is not necessary to etch to expose the third semiconductor layer 121 in the region adjacent to the first light emitting structure 110. That is, according to the semiconductor device Q5, the area of the active layer can be enlarged as compared with the semiconductor device Q1 as shown in the (e) of FIG. 14. Thus, according to the semiconductor device Q5 of the embodiment, the area of the active layer can be increased and the luminous intensity Po can be increased.

Meanwhile, the semiconductor device Q6 shown in the (f) of FIG. 13 differs from the semiconductor device Q1 shown in the (a) of FIG. 13 in the shape of the second light emitting structure 120. In addition, the semiconductor device Q6 differs from the semiconductor device Q1 in electrical connection between the connection electrode 150 and the third semiconductor layer 121.

As shown in the (f) of FIG. 14 and the (f) of FIG. 15, it is possible to see that the semiconductor device Q6 according to the embodiment can have protruding regions at the side surface of the second light emitting structure 120, a contact region H1 exposing the third semiconductor layer 121 in a concave region between protruding regions may be provided in a plurality of holes by the first insulating layer 161.

Thus, the electrical connection between the connection electrode 150 provided in the contact region H1 and the third semiconductor layer 121 can be provided in point contact. That is, each of the electrical connection between the first branch electrode 150b and the third semiconductor layer 121, the electrical connection between the second branch electrode 150c and the third semiconductor layer 121, and the electrical connection between the third branch electrode 150d and the third semiconductor layer 121 may be provided in point contact.

As described above, according to the semiconductor device Q6 of the embodiment, since the electrical connection between the connection electrode 150 and the third semiconductor layer 121 is provided in point contact, it is interpreted that the first insulating layer 161 has a function as a kind of current blocking layer, and the current spread is performed.

In addition, according to the semiconductor device Q6 of the embodiment, as shown in the (f) of FIG. 14, since the side surface of the second light emitting structure 120 is mesa-etched in a concavo-convex shape, an area of the active layer can be enlarged with reference to the semiconductor device Q1. Accordingly, according to the semiconductor device Q6 of the embodiment, the area of the active layer can be increased and the luminous intensity Po can be increased.

The characteristics of the semiconductor devices according to the embodiments described above are further summarized in [Table 1]. In [Table 1], the characteristics of each semiconductor device are shown based on the case where the chip size is 1500 micrometers in width and 500 micrometers in length, but the chip size of the semiconductor device may be variously changed according to the embodiment. In [Table 1], "n-contact region" indicates contact area between the connection electrode and the third semiconductor layer, and the values are measured when "the second insulating layer" is provided in the DBR.

TABLE 1

| Number | Q1 | Q2 | Q3 | Q4 | Q5 | Q6 |
|---|---|---|---|---|---|---|
| Chip size ($\mu m^2$) | | | 1500 * 500 | | | |
| Chip area ($\mu m^2$) | 750,000 | 750,000 | 750,000 | 750,000 | 750,000 | 750,000 |
| Active layer area ($\mu m^2$) | 588,018 | 584,747 | 577,331 | 588,018 | 596,258 | 604,241 |
| Ratio of the active layer (%) | 78.40 | 77.97 | 76.98 | 78.40 | 79.5 | 80.57 |
| n-contact region ($\mu m^2$) | 14,062 | 15,287 | 18,353 | 7,942 | 8,258 | 7,942 |
| Second insulating layer ($\mu m^2$) | 730,079 | 730,079 | 730,079 | 730,079 | 730,079 | 730,079 |
| VF3 (V at 100 mA) | 6.15 | 6.14 | 6.13 | 6.22 | 6.23 | 6.31 |
| Po (mW at 100 mA) | 296.3 | 296.2 | 296.0 | 296.6 | 297.4 | 297.7 |

According to the semiconductor device of the embodiment, as described in [Table 1], a voltage of several volts and a current of several hundreds of milliamperes can be applied and it can provide a luminance of several hundred milliwatts.

As described in [Table 1], it is confirmed that the semiconductor devices Q2 and Q3 according to the embodiments have a lower operating voltage VF3 than the semiconductor device Q1. The semiconductor devices Q2 and Q3 according to the embodiments can be interpreted as a result that the contact area between the connection electrode and the third semiconductor layer is increased as compared with the semiconductor device Q1 and the current spread is smoothly performed.

In addition, it can be seen that the semiconductor devices Q5 and Q6 according to the embodiments have a higher light output Po than the semiconductor device Q1. It can be interpreted that the semiconductor devices Q5 and Q6 according to the embodiments have increased light output while increasing the area of the active layer in accordance with the arrangement of the connection electrode compared to the semiconductor device Q1. In addition, the semiconductor device Q4 according to the embodiment was measured to have increased both the operating voltage VF3 and the light output Po in comparison with the semiconductor device Q1.

Meanwhile, the semiconductor device according to the embodiment described above can be applied to a semiconductor device package. The semiconductor device according to the embodiment may be electrically connected to a substrate or a lead electrode through a flip chip bonding method, a die bonding method, a wire bonding method, or the like to be provided as a semiconductor device package.

In addition, a plurality of semiconductor device packages according to the embodiments may be arrayed on a substrate, and an optical member such as a light guide plate, a prism sheet, a diffusion sheet, and the like may be disposed on the optical path of the semiconductor device package. Above semiconductor device packages, substrate, and optical members can function as a light unit.

Further, a display device, an indicating device, and a lighting apparatus including the semiconductor device package according to the embodiment can be realized.

Here, the display device may comprise a bottom cover, a reflector disposed on the bottom cover, a light emitting module emitting light and including a semiconductor device, a light guide plate disposed in front of the reflector and guiding light emitted from the light emitting module forward, an optical sheet including a prism sheet disposed in front of the light guide plate, a display panel disposed in front of the optical sheet, an image signal output circuit connected to the display panel and supplying an image signal to the display panel, and a color filter disposed in front of the display panel. Here, the bottom cover, the reflector, the light emitting module, the light guide plate, and the optical sheet may form a backlight unit.

In addition, the lighting apparatus may comprise a light source module including a substrate and the semiconductor device according to the embodiment, a heat sink dissipating heat of the light source module, and a power supply unit processing or converting an electrical signal provided from the outside and providing the electrical signal to the light source module. For example, the lighting apparatus may comprise a lamp, a head lamp, or a streetlight.

The head lamp may comprise a light emitting module including a semiconductor device disposed on a substrate, a reflector reflecting light emitted from the light emitting module in a predetermined direction, for example, forward direction, a lens refracting light reflected by the reflector forward direction, and a shade that blocks or reflects a part of the light reflected by the reflector and directed toward the lens to form a desired light distribution pattern by a designer.

The features, structures, effects and the like described in the above embodiments are included in at least one embodiment and are not limited to one embodiment only. Further, with respect to the features, structures, effects, and the like described in the embodiments, other embodiments may be carried out with combinations or modifications by those having ordinary skill in the art. Accordingly, the contents relevant to the combinations and modifications should be construed as being included in the scope of the embodiments.

Although preferable embodiments have been proposed and set forth in the aforementioned description, the present invention should not be construed as limited thereto. It will be apparent that various deformations and modifications not illustrated are available within the scope without departing from inherent features of the embodiment of the present invention by any one having ordinary skill in the art. For example, each component specifically shown in the embodiments may be carried out with the modifications. In addition, it is apparent that differences relevant to the modifications and deformations are included in the scope of the embodiments set in the accompanying claims of the present invention.

INDUSTRIAL APPLICABILITY

According to the semiconductor device and the method of manufacturing the semiconductor device of the embodiments, there is an advantage that high power can be applied and high power light can be provided.

According to the semiconductor device and the method of manufacturing the semiconductor device of the embodiments, there is an advantage that a plurality of light emitting structures can be connected in series to prevent current concentration phenomenon from occurring, thereby improving reliability.

According to the semiconductor device and the method of manufacturing the semiconductor device of the embodiments, there is an advantage that the reflective electrode and the pad electrode can be arranged so as to be suitable for flip chip bonding method, thereby facilitating the bonding process and improving the light extraction efficiency by increasing the reflectance of the emitted light.

The invention claimed is:

1. A semiconductor device comprising:
   a substrate;
   a first light emitting structure disposed on the substrate, the first light emitting structure comprising a first semiconductor layer of a first conductivity type, a first active layer disposed on the first semiconductor layer, and a second semiconductor layer of a second conductivity type, the first light emitting structure providing a first through hole through the second semiconductor layer and the active layer to expose the first semiconductor layer;
   a second light emitting structure disposed on the substrate and spaced apart from the first light emitting structure, the second light emitting structure comprising a third semiconductor layer of the first conductivity type, a second active layer disposed on the third semiconductor layer, and a fourth semiconductor layer of the second conductivity type;
   a first reflective electrode disposed on the second semiconductor layer of the first light emitting structure;
   a second reflective electrode disposed on the fourth semiconductor layer of the second light emitting structure;
   a connection electrode electrically connected to the second semiconductor layer of the first light emitting structure and the third semiconductor layer of the second light emitting structure;
   a first electrode pad disposed on the first light emitting structure and electrically connected to the first semiconductor layer through the first through hole of the first light emitting structure; and
   a second electrode pad disposed on the second light emitting structure and electrically connected to the second reflective electrode,
   wherein the connection electrode comprises a main electrode,
   wherein a first region of the main electrode overlaps with the first reflective electrode and the second semiconductor layer in a vertical direction,
   wherein a second region of the main electrode overlaps with the third semiconductor layer in the vertical direction, and
   wherein a third region of the main electrode is extended from an upper surface of the first semiconductor layer to an upper surface of the third semiconductor layer when viewed in the vertical direction.

2. The semiconductor device of claim 1, wherein the first electrode pad, the first semiconductor layer, the second semiconductor layer, the connection electrode, the third semiconductor layer, the fourth semiconductor layer, and the second electrode pad are electrically connected in series.

3. The semiconductor device of claim 1, comprising:
a first ohmic contact layer disposed between the first reflective electrode and the second semiconductor layer; and
a second ohmic contact layer disposed between the second reflective electrode and the fourth semiconductor layer.

4. The semiconductor device of claim 1, wherein the connection electrode is in contact with the upper surface of the third semiconductor layer and an upper surface of the first reflective electrode.

5. The semiconductor device of claim 1, wherein the connection electrode is disposed between a side surface of the first light emitting structure and a side surface of the second light emitting structure facing each other.

6. The semiconductor device of claim 1, wherein the connection electrode further comprises a first branch electrode directly connected to the main electrode, a second branch electrode extended from an end of the first branch electrode, and a third branch electrode extended from another end of the first branch electrode,
wherein the first region of the main electrode is disposed on the second semiconductor layer and the third region of the main electrode is disposed between a side surface of the first light emitting structure and a side surface of the second light emitting structure, and
wherein the first branch electrode, the second branch electrode, and the third branch electrode are disposed on the third semiconductor layer.

7. The semiconductor device of claim 6, further comprising a first insulating layer providing a contact region for exposing the upper surface of the third semiconductor layer, and
wherein the first branch electrode, the second branch electrode, the third branch electrode, and the third semiconductor layer are electrically connected through the contact region.

8. The semiconductor device of claim 7, wherein the first branch electrode, the second branch electrode, and the third branch electrode are disposed in contact with the upper surface of the third semiconductor layer through the contact region.

9. The semiconductor device of claim 6, further comprising a fourth branch electrode disposed on the third semiconductor layer and connecting the second branch electrode and the third branch electrode,
wherein the first branch electrode, the second branch electrode, the third branch electrode, and the fourth branch electrode are disposed around the second light emitting structure to provide a closed loop.

10. The semiconductor device of claim 7, wherein the first insulating layer comprises a second through hole exposing the upper surface of the first semiconductor layer,
further comprising a second insulating layer, the second insulating layer disposed on the first insulating layer and providing a third through hole connected to the second through hole and exposing the upper surface of the first semiconductor layer, and
wherein the first electrode pad is electrically connected to the first semiconductor layer through the second through hole and the third through hole.

11. The semiconductor device of claim 1, further comprising a first insulating layer disposed in the first through hole and providing a second through hole to expose the upper surface of the first semiconductor layer.

12. The semiconductor device of claim 11, wherein a portion of the first insulating layer is disposed on the second semiconductor layer, and
wherein the first insulating layer is a Distributed Bragg Reflector.

13. The semiconductor device of claim 1, wherein the connection electrode further comprises a first branch electrode, a second branch electrode, and a third branch electrode,
wherein the first branch electrode is extended from the main electrode and disposed in contact with the upper surface of the third semiconductor layer,
wherein the second branch electrode is extended from an end of the first branch electrode and disposed in contact with the upper surface of the third semiconductor layer,
wherein the third branch electrode is extended from another end of the first branch electrode and disposed in contact with the upper surface of the third semiconductor layer and wherein the second branch electrode and the third branch electrode are disposed at side surfaces of the second light emitting structure, respectively.

14. The semiconductor device of claim 1, wherein light generated in the first active layer is reflected by the first reflective electrode and emitted toward the substrate, and
wherein light generated in the second active layer is reflected by the second reflective electrode and emitted toward the substrate.

15. A semiconductor device comprising:
a substrate;
a first light emitting structure disposed on the substrate, the first light emitting structure comprising a first semiconductor layer of a first conductivity type, a first active layer disposed on the first semiconductor layer, and a second semiconductor layer of a second conductivity type, the first light emitting structure providing a first through hole through the second semiconductor layer and the active layer to expose the first semiconductor layer;
a second light emitting structure disposed on the substrate and spaced apart from the first light emitting structure, the second light emitting structure comprising a third semiconductor layer of the first conductivity type, a second active layer disposed on the third semiconductor layer, and a fourth semiconductor layer of the second conductivity type;
a first reflective electrode disposed on the second semiconductor layer of the first light emitting structure;
a second reflective electrode disposed on the fourth semiconductor layer of the second light emitting structure;
a connection electrode electrically connected to the second semiconductor layer of the first light emitting structure and the third semiconductor layer of the second light emitting structure;
a first electrode pad disposed on the first light emitting structure and electrically connected to the first semiconductor layer through the first through hole of the first light emitting structure; and
a second electrode pad disposed on the second light emitting structure and electrically connected to the second reflective electrode,
wherein the connection electrode is disposed in contact with an upper surface of the third semiconductor layer and an upper surface of the first reflective electrode,
wherein the connection electrode comprises a main electrode in contact with the upper surface of the first reflective electrode, wherein the connection electrode comprises a first branch electrode, a second branch electrode, and a third branch electrode, which are in contact with the upper surface of the third semiconductor layer, wherein the first branch electrode is connected in contact with the main electrode and disposed on the third semiconductor layer, wherein the second branch electrode is extended from an end of the first branch electrode and disposed on the third semiconductor layer, and wherein the third branch electrode is extended from another end of the first branch electrode parallel with the second branch electrode and disposed on the third semiconductor layer.

16. The semiconductor device of claim 15, further comprising a first insulating layer providing a first region exposing the upper surface of the third semiconductor layer, wherein the first branch electrode, the second branch electrode, and the third branch electrode are in contact with the upper surface of the third semiconductor layer through the first region.

17. The semiconductor device of claim 16, further comprising a fourth branch electrode disposed on the third semiconductor layer and connecting the second branch electrode and the third branch electrode, wherein the first branch electrode, the second branch electrode, the third branch electrode, and the fourth branch electrode are disposed around the second light emitting structure to provide a closed loop.

18. A semiconductor device comprising:

a substrate;

a first light emitting structure disposed on the substrate, the first light emitting structure comprising a first semiconductor layer of a first conductivity type, a first active layer disposed on the first semiconductor layer, and a second semiconductor layer of a second conductivity type, the first light emitting structure providing a first through hole through the second semiconductor layer and the active layer to expose the first semiconductor layer;

a second light emitting structure disposed on the substrate and spaced apart from the first light emitting structure, the second light emitting structure comprising a third semiconductor layer of the first conductivity type, a second active layer disposed on the third semiconductor layer, and a fourth semiconductor layer of the second conductivity type;

a first reflective electrode disposed on the second semiconductor layer of the first light emitting structure;

a second reflective electrode disposed on the fourth semiconductor layer of the second light emitting structure;

a connection electrode electrically connected to the second semiconductor layer of the first light emitting structure and the third semiconductor layer of the second light emitting structure;

a first electrode pad disposed on the first light emitting structure and electrically connected to the first semiconductor layer through the first through hole of the first light emitting structure; and a second electrode pad disposed on the second light emitting structure and electrically connected to the second reflective electrode, wherein the connection electrode comprises a main electrode, a first branch electrode connected in contact with the main electrode, a second branch electrode extended from an end of the first branch electrode, and a third branch electrode extended from another end of the first branch electrode and disposed parallel with the second branch electrode, a first region of the main electrode overlaps with the second semiconductor layer in a vertical direction and a second region of the main electrode overlaps with the third semiconductor layer in the vertical direction, wherein light generated in the first active layer is reflected by the first reflective electrode and emitted toward the substrate, and wherein light generated in the second active layer is reflected by the second reflective electrode and emitted toward the substrate.

19. The semiconductor device of claim 18, further comprising a first insulating layer providing a first region exposing an upper surface of the third semiconductor layer, wherein the first branch electrode, the second branch electrode, and the third branch electrode are in contact with the upper surface of the third semiconductor layer through the first region.

* * * * *

UNITED STATES PATENT AND TRADEMARK OFFICE
CERTIFICATE OF CORRECTION

PATENT NO. : 11,121,286 B2
APPLICATION NO. : 16/472429
DATED : September 14, 2021
INVENTOR(S) : Jae Won Seo Page 1 of 1

It is certified that error appears in the above-identified patent and that said Letters Patent is hereby corrected as shown below:

On the Title Page

Replace:
"(71) Applicant: SUZHOU LEKTN SEMICONDUCTOR CO., LTD., Taicang (CN)"

With:
--(71) Applicant: SUZHOU LEKIN SEMICONDUCTOR CO., LTD., Taicang (CN)--

Replace:
"(73) Assignee: SUZHOU LEKTN SEMICONDUCTOR CO., LTD., Taicang (CN)"

With:
--(73) Assignee: SUZHOU LEKIN SEMICONDUCTOR CO., LTD., Taicang (CN)--

Signed and Sealed this
Twenty-third Day of November, 2021

Drew Hirshfeld
*Performing the Functions and Duties of the
Under Secretary of Commerce for Intellectual Property and
Director of the United States Patent and Trademark Office*